(12) United States Patent
Kuznetsov

(10) Patent No.: US 11,404,876 B2
(45) Date of Patent: Aug. 2, 2022

(54) HYBRID ENERGY STORAGE MODULES FOR PULSED POWER EFFECTORS WITH MEDIUM VOLTAGE DIRECT CURRENT (MVDC) POWER DISTRIBUTION

(71) Applicant: Raytheon Company, Waltham, MA (US)

(72) Inventor: Stephen Kuznetsov, Marlborough, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/089,671

(22) Filed: Nov. 4, 2020

(65) Prior Publication Data
US 2021/0376610 A1  Dec. 2, 2021

Related U.S. Application Data

(60) Division of application No. 16/148,331, filed on Oct. 1, 2018, now Pat. No. 10,985,563, which is a continuation of application No. PCT/US2017/025619, filed on Mar. 31, 2017.
(Continued)

(51) Int. Cl.
*H02J 3/30* (2006.01)
*H02J 3/32* (2006.01)
(Continued)

(52) U.S. Cl.
CPC ............. *H02J 3/30* (2013.01); *H02J 3/32* (2013.01); *H02J 7/0068* (2013.01);
(Continued)

(58) Field of Classification Search
CPC .... H02J 3/30; H02J 3/32; H02J 7/0068; H02J 7/1423; H02J 7/345; H02J 2310/42;
(Continued)

(56) References Cited

U.S. PATENT DOCUMENTS 3,975,646 A * 8/1976 Kilgore ................ H02J 3/34
307/21
5,239,250 A   8/1993 Kalman et al.
(Continued)

FOREIGN PATENT DOCUMENTS

EP   2293407 A1   9/2011
EP   2394908 A1   12/2011

OTHER PUBLICATIONS

International Search Report and Written Opinion of the International Searching Authority dated Feb. 8, 2018 in connection with International Patent Application No. PCT/US2017/025619, 24 pages.
(Continued)

*Primary Examiner* — Toan T Vu

(57) ABSTRACT

A system includes a source configured to provide power to a medium-voltage direct current (MVDC) bus. The system also includes a plurality of rotating electrical machines configured to receive the power from the MVDC bus. The rotating electrical machines are arranged in a cascaded configuration. One of the rotating electrical machines is configured to act as a slave to another of the rotating electrical machines. Each rotating electrical machine is mechanically connected to an inertial energy storage. The system further includes a plurality of isolated battery or ultra-capacitor subsystems electrically connected to each rotating electrical machine. The battery or ultra-capacitor subsystems are configured to receive electrical energy from and provide electrical energy to each rotating electrical machine and the connected inertial energy storage.

21 Claims, 24 Drawing Sheets

Related U.S. Application Data

(60) Provisional application No. 62/317,431, filed on Apr. 1, 2016.

(51) Int. Cl.

| | | |
|---|---|---|
| *H02J 7/00* | (2006.01) | |
| *H02J 7/14* | (2006.01) | |
| *H03K 3/57* | (2006.01) | |
| *H02K 7/02* | (2006.01) | |
| H02P 25/22 | (2006.01) | |
| H02J 7/34 | (2006.01) | |

(52) U.S. Cl.
CPC ............ *H02J 7/1423* (2013.01); *H02K 7/025* (2013.01); *H03K 3/57* (2013.01); *H02J 7/345* (2013.01); *H02P 25/22* (2013.01); *Y02E 60/16* (2013.01)

(58) Field of Classification Search
CPC .......... H02K 7/025; H03K 3/57; H02P 25/22; Y02E 60/16
See application file for complete search history.

(56) References Cited

U.S. PATENT DOCUMENTS

| | | |
|---|---|---|
| 8,264,209 B2 | 9/2012 | Kretschmann |
| 10,450,080 B1* | 10/2019 | Beach .................... B64D 27/02 |
| 2002/0101119 A1 | 8/2002 | Eisenhaure et al. |
| 2012/0217802 A1 | 8/2012 | Kanakasabai et al. |
| 2012/0299305 A1 | 11/2012 | Brogan et al. |
| 2014/0346868 A1* | 11/2014 | Kuznetsov ................ H02J 1/00 307/18 |
| 2015/0288271 A1 | 10/2015 | Kuznetsov |
| 2016/0197558 A1 | 7/2016 | Whitehouse et al. |

OTHER PUBLICATIONS

Petersen, "Next Generation Power and Energy", Exponaval 2010, Dec. 2010, 30 pages.

Raju, "Silicon Carbide High Voltage, High Frequency Conversion", NIST High Megawatt Variable Speed Drive Technology Workshop, GE, Apr. 2014, 15 pages.

Sodhi, "Electro Magnetic Aircraft Launch System", Centre for Air Power Studies (CAPS), May 2015, 8 pages.

"EMALS, Electromagnetic Aircraft Launch System, System Development & Demonstration Phase", General Atomics, Dec. 2010, 2 pages.

Arseneaux, "Development of a 100 kWh/100kW Flywheel Energy Storage Module", Beacon Power, Mar. 2012, 2 pages.

Strasik et al., "Design, Fabrication, and Test of a 5-kWh/100-kW Flywheel Energy Storage Utilizing a High-Temperature Superconducting Bearing", Nov. 2007, 29 pages.

Communication pursuant to Article 94(3) EPC dated Oct. 15, 2020 in connection with counterpart European Patent Application No. 17787271.0, 5 pages.

European Search Report dated Apr. 19, 2021 in connection with European Patent Application No. 21155083.5, 11 pages.

Communication Pursuant to Article 94(3) EPC dated Jun. 9, 2021 in connection with European Patent Application No. 17787271.0, 5 pages.

European Search Report dated Apr. 21, 2021 in connection with European Patent Application No. 21155136.1, 9 pages.

Walls et al., "Rotating Machines for Pulsed Power", Conference Record of the 25th International Power Modulator Symposium and 2002 High-Voltage Workshop, June-Jul. 2002, 6 pages.

Office Action dated Dec. 22, 2021 in connection with U.S. Appl. No. 17/089,592, 16 pages.

\* cited by examiner

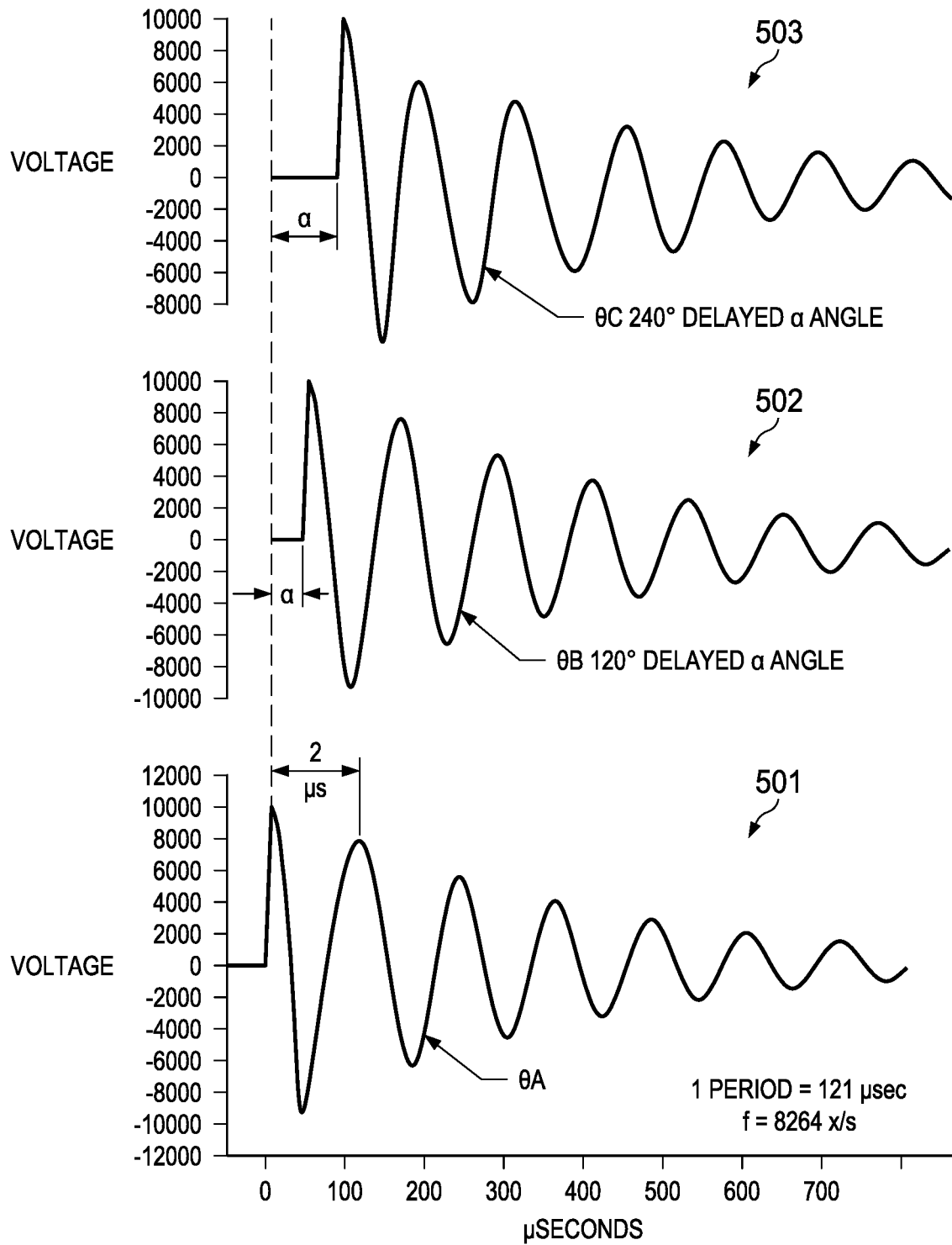

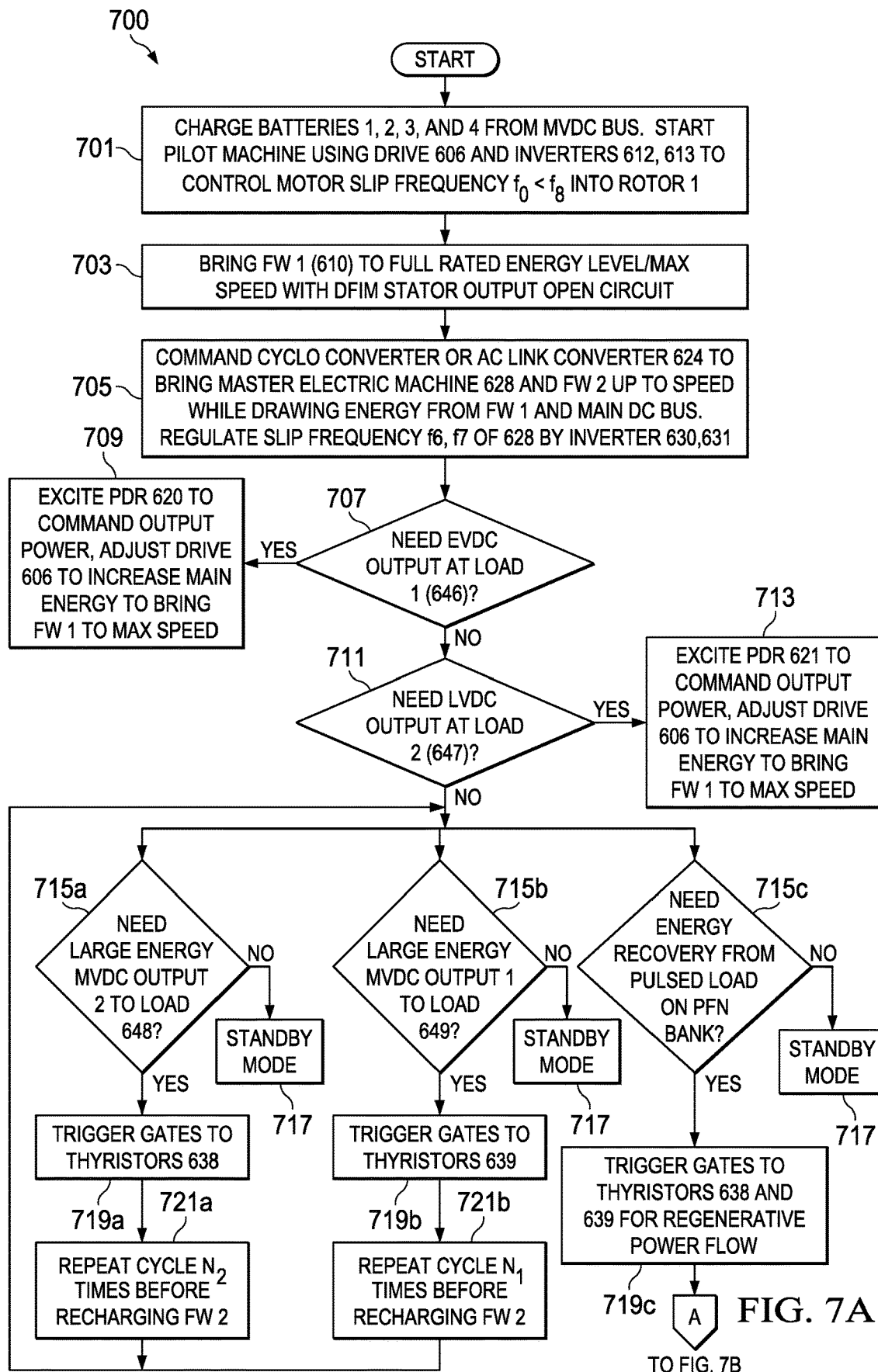

HYBRID ENERGY STORAGE MODULES FOR PULSED POWER EFFECTORS WITH MEDIUM VOLTAGE DIRECT CURRENT (MVDC) POWER DISTRIBUTION

CROSS-REFERENCE TO RELATED APPLICATION AND PRIORITY CLAIM

This application is a divisional of U.S. patent application Ser. No. 16/148,331 filed on Oct. 1, 2018, which is a continuation of International Patent Application No. PCT/US2017/025619 filed on Mar. 31, 2017, which claims priority to U.S. Provisional Patent Application No. 62/317,431 filed on Apr. 1, 2016. All of these prior applications are hereby incorporated by reference in their entirety.

GOVERNMENT LICENSE RIGHTS

This invention was made with government support under Contract No. N00014-14-C-0083 awarded by the United States Navy. The government has certain rights in the invention.

TECHNICAL FIELD

This disclosure is generally related to power systems. More specifically, this disclosure is directed to hybrid energy storage modules for pulsed power effectors with medium voltage direct current (MVDC) power distribution.

BACKGROUND

Hybrid energy storage modules (HESMs) are being developed to support the storage and control of large amounts of electrical energy and to allow variable charging and discharging rates of that electrical energy. These types of storage modules could find use in a number of military and civilian applications.

SUMMARY

This disclosure provides hybrid energy storage modules for pulsed power effectors with medium voltage direct current (MVDC) power distribution.

In a first embodiment, a system includes a source configured to provide power to an MVDC bus. The system also includes a plurality of rotating electrical machines configured to receive the power from the MVDC bus. The rotating electrical machines are arranged in a cascaded configuration. One of the rotating electrical machines is configured to act as a slave to another of the rotating electrical machines. Each rotating electrical machine is mechanically connected to an inertial energy storage. The system further includes a plurality of isolated battery or ultra-capacitor subsystems electrically connected to each rotating electrical machine. The battery or ultra-capacitor subsystems are configured to receive electrical energy from and provide electrical energy to each rotating electrical machine and the connected inertial energy storage.

In a second embodiment, a system includes a power generator configured to provide power to a direct current (DC) bus. The system also includes a plurality of rotating electrical machines configured to receive the power from the DC bus and provide at least some of the power to multiple pulsed loads. The rotating electrical machines are arranged in a cascaded configuration. One of the rotating electrical machines is configured to act as a slave to another of the rotating electrical machines. Each rotating electrical machine is mechanically connected to an inertial energy storage. The system further includes a plurality of isolated battery or ultra-capacitor subsystems electrically connected to each rotating electrical machine. The battery or ultra-capacitor subsystems are configured to receive electrical energy from and provide electrical energy to each rotating electrical machine and the connected inertial energy storage.

In a third embodiment, a system includes a source configured to provide power to a DC bus. The system also includes a plurality of rotating electrical machines configured to receive the power from the DC bus. The rotating electrical machines are arranged in a cascaded configuration. One of the rotating electrical machines is configured to act as a slave to another of the rotating electrical machines. Each rotating electrical machine is mechanically connected to an inertial energy storage. Each rotating electrical machine has at least one stator port coupled to one or more power converters that provide at least some of the power to one or more loads. The system further includes a plurality of isolated battery or ultra-capacitor subsystems electrically connected to each rotating electrical machine. The battery or ultra-capacitor subsystems are configured to receive electrical energy from and provide electrical energy to each rotating electrical machine and the connected inertial energy storage.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which:

FIG. 5 illustrates example waveforms for PFN excitation of the tertiary winding with three-phase triggered switches and 120° offset between each wave according to this disclosure;

FIGS. 7A and 7B illustrate an example method for operating a hybrid energy storage system according to this disclosure;

DETAILED DESCRIPTION

Figure 1:
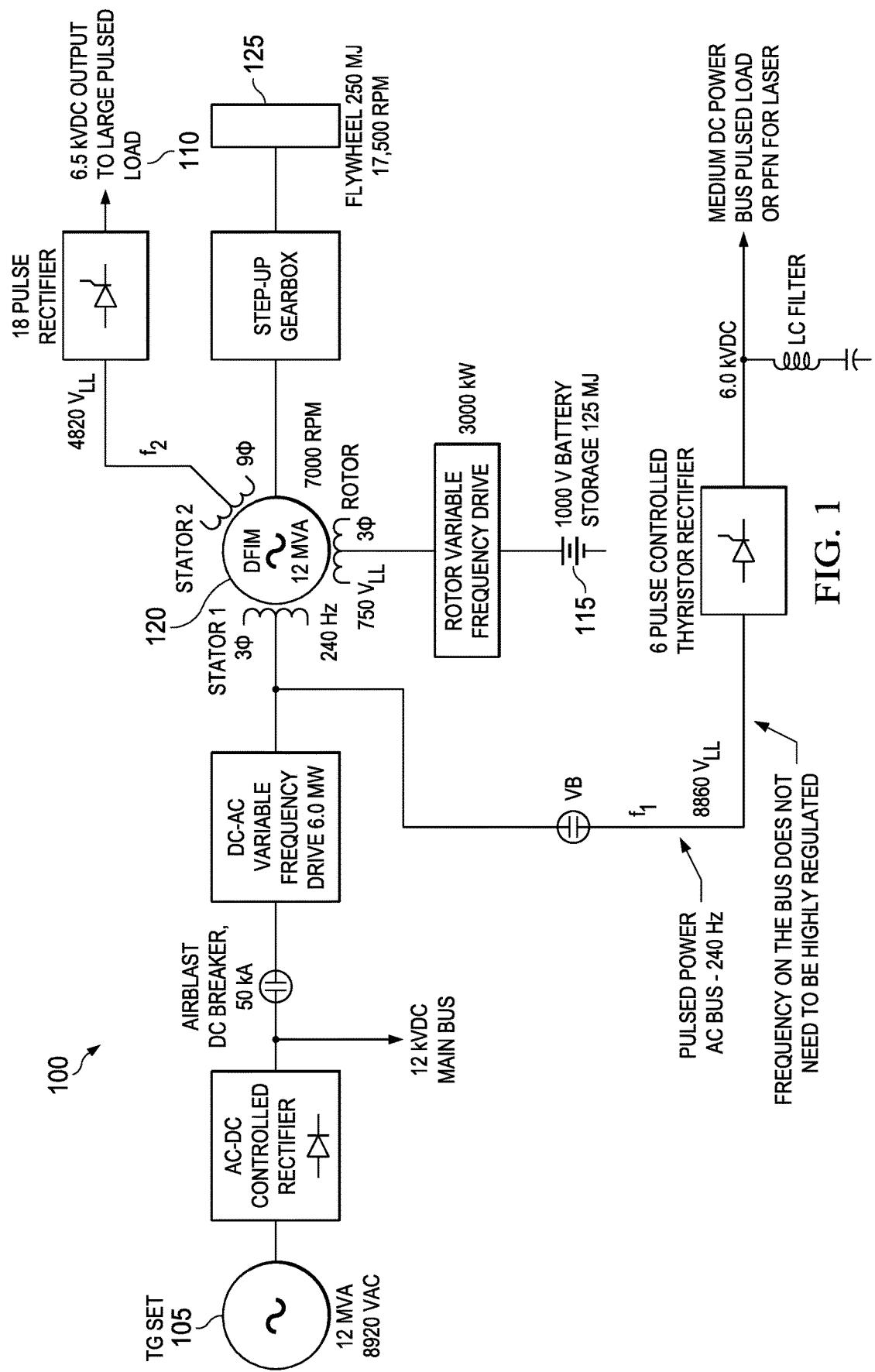
FIG. 1 illustrates an example hybrid energy storage system according to this disclosure.

FIGS. 1 through 14, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure.

Among other things, this disclosure provides hybrid energy storage module (HESM) architectures that utilize a doubly-fed induction electrical machine (DFIM) coupled to a high-speed flywheel of an inertial-flywheel energy storage in conjunction with a high-density large-capacity battery bank or ultra-capacitor bank. Other configurations are shown using a wound-field synchronous electrical machine with multiple stator electrical ports. The battery bank or ultra-capacitor bank provides rotor excitation to the electrical machine. The battery bank or ultra-capacitor bank is buffered from fast pulse load transients while providing rapid excitation of the electrical machine, which acts as a rotating amplifier and buffer to a main power system. The DFIM or the synchronous electrical machine has multiple output high-voltage windings and can serve as a multi-function multi-megawatt power modulator. The described architectures can provide superior configuration flexibility, superior modularity, and improved overall efficiency (such as at least about 90% efficiency).

One example use of the described architectures is for powering multiple classes of electromagnetic effectors on naval vessels. The described architectures can utilize a medium voltage direct current (MVDC) main electrical distribution bus for a vessel and can buffer turbine generators from high pulsed loads. The HESM can support a wide range of output impedances, a wide range of repetition rates (rep-rates), and fast rise times at the multi-megawatt level. The described architectures also provide high galvanic isolation of the pulsed loads from the turbine generators or main ship bus. MVDC is generally accepted to refer to voltage in a range from about 1 KVDC to about 35 kVDC. Thus, the MVDC bus could denote a bus providing about 1 kVDC to about 35 kVDC. A specific benefit of the described architectures (in addition to performance benefits) is that they can reduce or eliminate the need for large power transformers on a naval vessel. In some instances, this could eliminate the need for about ninety tons of equipment, resulting in considerable size, cost, and weight reductions.

FIG. 1 illustrates an example hybrid energy storage system 100 according to this disclosure. As shown in FIG. 1, the system 100 includes a high-voltage MVDC power input 105, a single high-voltage pulsed output 110, and a single energy storage battery or ultra-capacitor bank subsystem 115. The system 100 also includes a wound rotor induction machine 120 as a baseline electrical machine. In some embodiments, the induction machine 120 is a DFIM. Thus, the system 100 features a combination of a high-voltage input and a DFIM used as the electrical machine. Total stored energy is partitioned between a flywheel 125 and the battery or ultra-capacitor bank subsystem 115, where each has different time constants and different speeds of response. The system 100 also includes a pulsed power AC bus (240 Hz), which becomes rectified to form a medium power DC pulsed power bus.

Various elements in FIG. 1 may be the same as or similar to components in other HESM patent documents filed by the inventor, which include designs that supply primary power by an AC power system. These other HESM patent documents include U.S. Pat. Nos. 9,531,289; 9,373,963; 9,531,247; U.S. Patent Publication No. 2016/0055971; U.S. Patent Publication No. 2016/0197600; and U.S. Patent Publication No. 2016/0336928 (all of which are hereby incorporated by reference in their entirety). Note that specific values and specific component types in FIG. 1 are examples only.

Although FIG. 1 illustrates one example of a hybrid energy storage system 100, various changes may be made to FIG. 1. For example, while the system 100 shows one battery or ultra-capacitor bank subsystem 115, other embodiments may include additional battery or ultra-capacitor bank subsystems. Also, the makeup and arrangement of the system 100 are for illustration only. Components could be added, omitted, combined, or placed in any other configuration according to particular needs.

Figure 2A:
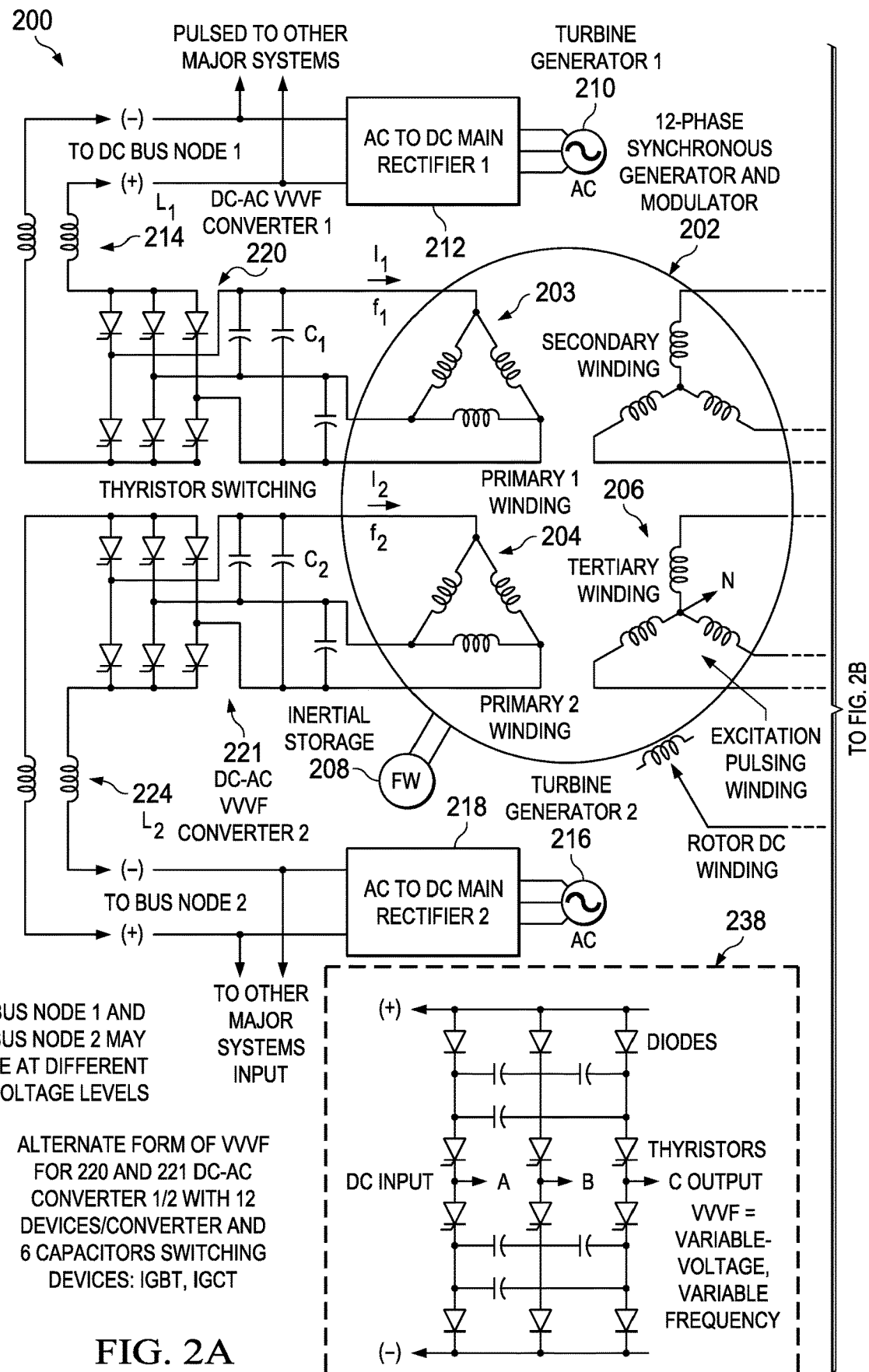
FIGS. 2A and 2B illustrate another example hybrid energy storage system according to this disclosure.
Figure 2B:
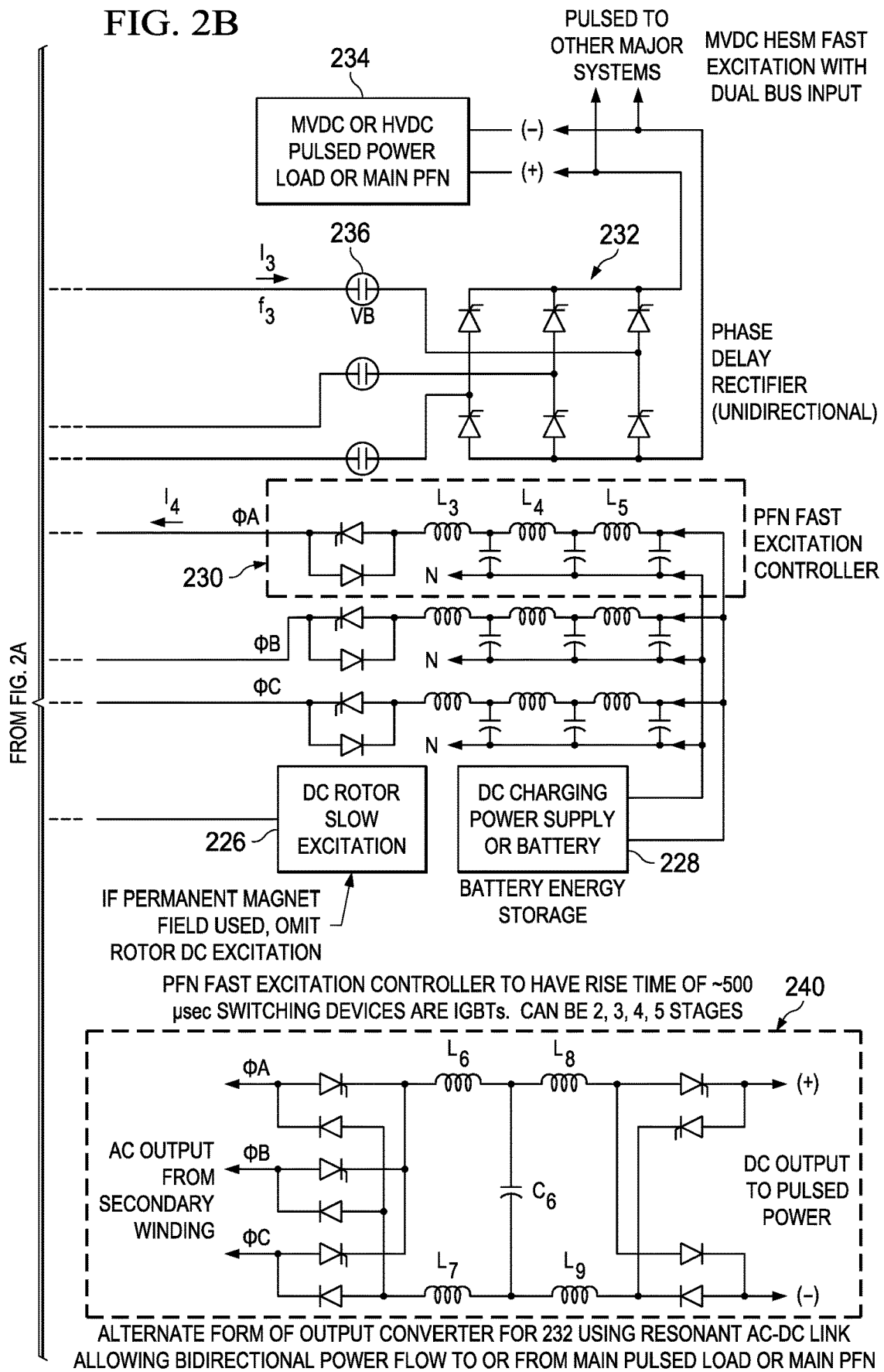

FIGS. 2A and 2B illustrate another example hybrid energy storage system 200 according to this disclosure. The system 200 includes two or more independent MVDC inputs, two or more sources of synchronous electrical machine excitation, one main machine output for pulsed loads, and one auxiliary output for charging to a main battery or ultra-capacitor bank subsystem.

As shown in FIGS. 2A and 2B, the system 200 is an integrated system that allows two sources of medium voltage DC power from two turbine generators 210 and 216 to power an HESM, which has a synchronous electrical machine 202 with (for example) four input/output ports. This arrangement allows for a circumstantial mismatch in the source DC voltage levels or a deliberate use of two sources with widely different source voltage or power ratings. Additionally or alternatively, the use of two or more sources provides a redundancy capability for situations where one source is temporarily unavailable due to fault, maintenance, and the like.

The turbine generators 210 and 216 feed two main power system rectifiers 212 and 218 to create bus nodes #1 and #2, which feed the electrical machine 202 through two filter inductors 214 and 224. The electrical machine 202 is a wound-field synchronous machine with a DC field winding and/or brushless exciter. The electrical machine 202 includes primary windings 203 and 204, each of which is powered by a separate variable-voltage variable-frequency (VVVF) power converter 220 and 221, respectively. The VVVF power converters 220 and 221 are configured to operate the electrical machine 202 at adjustable speeds and stored energy levels. The primary windings 203 and 204 constitute two ports, which are bidirectional in power flow, are arranged on a common machine stator, and (in the most basic case) are equally rated in kW/kVA capacity and have the same flux/pole and voltage rating. When the two DC sources are of substantially different power or kVA levels, the windings 203 and 204 can occupy a proportionate amount of stator peripheral volume in direct accordance with their kVA rating. In both cases, the spatial winding layout of the electrical machine 202 permits the magnetic flux contributed by each winding 203 and 204 to be additive to the total machine airgap flux and additive to the total machine torque production.

Since the two primary windings 203 and 204 are separate AC polyphase windings, galvanic isolation between these windings 203 and 204 can be very large (such as 75 kV). This scheme also helps to ensure that a DC fault on bus node #1 does not directly propagate into bus node #2 or vice versa. Thus, a system fault on one DC bus can be quickly isolated (such as within 100 microseconds) from the opposing DC bus (such as by a thyristor switching network of one of the converters 220 and 221), and the system 200 runs at a minimum of one-half power level continuously. In addition, the arrangement allows one of the turbine generators 210 and 216 to provide the initial starting kinetic energy to bring the flywheel of an inertial flywheel storage unit 208 from a dead start to maximum speed. Thereafter, the kinetic energy is derived from the other turbine generator 210 and 216 to handle load swings over the upper speed range for modulation of shaft speed (such as from 75% to 100%).

This arrangement provides for the electrical machine 202 to be directly or indirectly (such as through a gearbox unit) coupled to the inertial flywheel storage unit 208, which provides bidirectional energy to the electrical machine 202 and hence to one or more output ports. FIGS. 2A and 2B show only one main output port and one auxiliary bidirectional port, while FIGS. 3A and 3B (discussed below) show multiple output ports.

The electrical machine 202 also includes a stator winding 206 that is designated as a tertiary winding and has dual-mode operation. Normally, the winding 206 is an input port that receives excitation energy from the battery or ultra-capacitor bank subsystem. However, the winding 206 can also operate as an output port to recharge an auxiliary battery 228. All ports can have high galvanic isolation from each other in order to protect inputs from output electrical transients and short circuits. In some embodiments, the winding 206 includes a special fast excitation port, and this port has a fast response excitation current controller 230. The components forming each phase of the controller 230 could include a pulse forming network (PFN) of capacitor-inductor elements that are charged by the auxiliary battery 228 or other DC source such as an ultra-capacitor. Each phase of the controller 230 contains an output thyristor-diode pair for discharging three or more PFNs in a sequential fashion so as to create a traveling wave excitation to the winding 206. This tertiary excitation normally boosts the main field excitation supplied by the rotor DC winding part of the slow excitation source 226 and also boosts the quadrature component of excitation provided by the primary winding(s). This arrangement provides for fast control of output pulses beyond normal generator control systems typical of conventional devices with only rotor DC current control.

In the system 200, the auxiliary battery 228 represents a DC charging supply that is fed by either a high-density electrochemical battery system or an ultra-capacitor system, both of which are capable of long-term energy storage and at high capacity. Current technologies for these subsystems, however, may limit the recharge rate for both types, and the electrical machine 202 may be better adapted for accepting high rates of recharge energy from the turbine generators 210 and 216. Also, current battery and ultra-capacitor storage technologies are limited in safe maximum voltage (such as 1000 VDC) for a stacked module. In contrast, embodiments of this disclosure combine with the electrical machine 202 to permit main output voltages to be much higher (such as 10 kV to 100 kV levels) without penalty or substantial reduction of efficiency.

The system 200 also includes a conventional phase-delay bridge rectifier 232 (e.g., 6 or 12 pulse), an MVDC or HVDC pulsed load 234, a vacuum circuit breaker 236, an alternate VVVF converter 238, and an AC-DC converter 240 with a resonant type AC link and polyphase input.

Although FIGS. 2A and 2B illustrate another example of a hybrid energy storage system 200, various changes may be made to FIGS. 2A and 2B. For example, the system 200 could include three or more of each of the turbine generators, primary windings, and associated components. Also, the makeup and arrangement of the system 200 are for illustration only. Components could be added, omitted, combined, or placed in any other configuration according to particular needs.

Figure 3A:
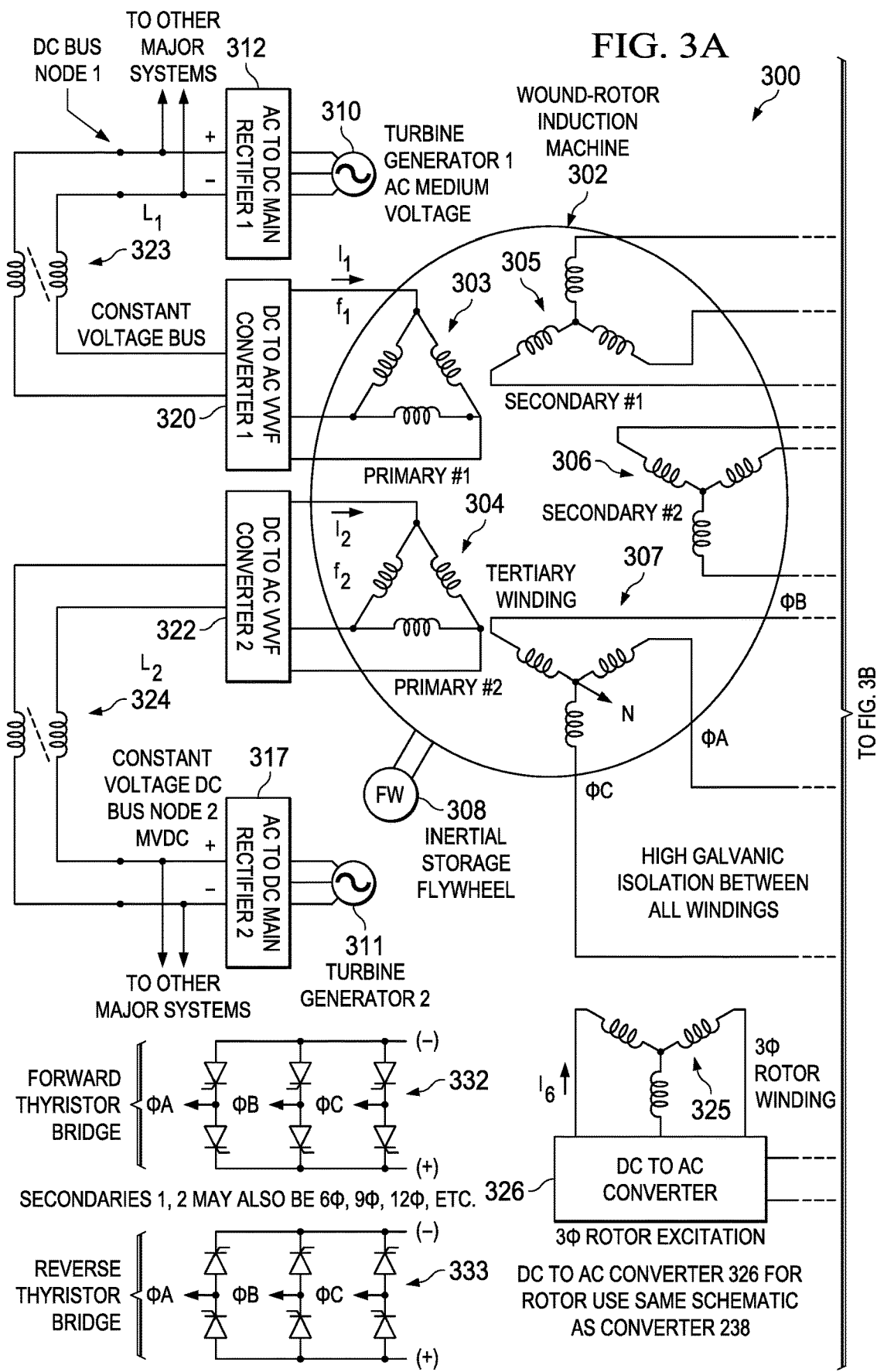
FIGS. 3A through 3B illustrate yet another example hybrid energy storage system according to this disclosure.
Figure 3B:
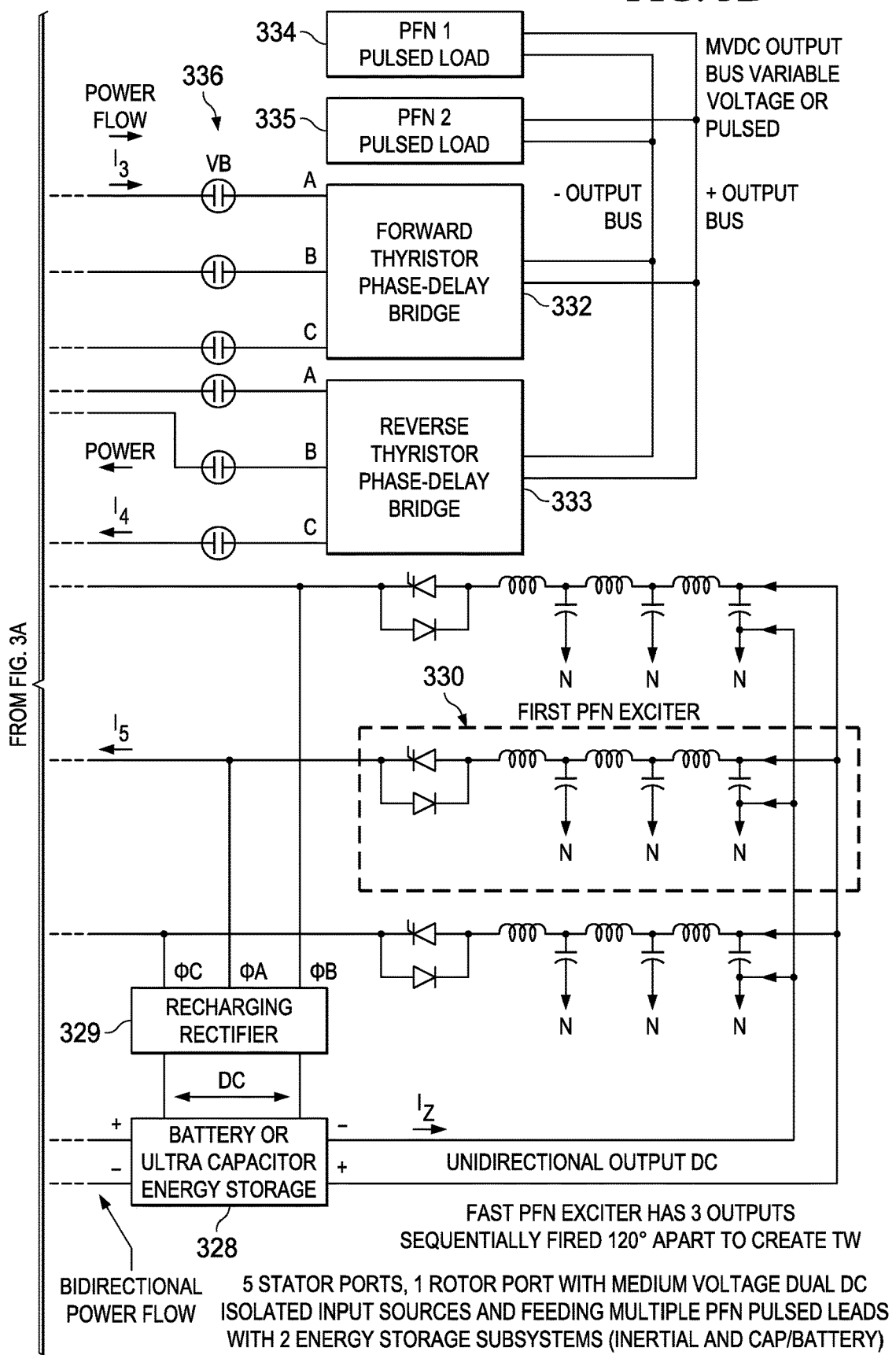

FIGS. 3A and 3B illustrate yet another example hybrid energy storage system 300 according to this disclosure. The system 300 includes two MVDC sources and an electrical wound-rotor DFIM with five stator ports, one rotor port, and two types of energy storage. The system 300 features the wound-rotor DFIM as the primary electrical machine instead of the synchronous electrical machine 202 as in FIGS. 2A and 2B.

As shown in FIGS. 3A and 3B, two turbine generators 310 and 311 operate as sources of medium voltage DC power for an HESM that includes a DFIM 302. The DFIM 302 includes five stator ports with windings 303-307 and is mechanically coupled to a flywheel energy storage 308. The turbine generators 310 and 311 feed main power system rectifiers 312 and 317 to create bus nodes #1 and #2, which feed the DFIM 302 through filter inductors 323 and 324. Each primary winding 303 and 304 of the DFIM 302 is powered by a separate variable-voltage variable-frequency (VVVF) power converter 320 and 322, respectively. The VVVF power converter 320 and 322 can represent or be represented by the VVVF converter 238 of FIGS. 2A and 2B.

A polyphase rotor field 325 is excited from a DC-to-AC converter 326 that derives energy from an electrochemical battery or ultra-capacitor bank subsystem 328, which is shown as being charged from the tertiary stator winding 307 similar to a conventional "boot-strap" excitation scheme. The converter 326 can represent or be represented by the converter 238 of FIGS. 2A and 2B. Doubly-fed induction machines are well-known but typically have not been used with high slew-rate pulsed power. In some respects, the system 300 offers greater operational flexibility than the system 200 by virtue of having a variable-frequency excited rotor field. The slip frequency of the rotor current $I_6$ can be actively controlled by the converter 326 to yield mainly steady-state performance and to regulate the reactive kVA and real kVA outputs of two secondary windings 305 and 306 having output current $I_3$ and regenerative/reverse current $I_4$. Thus, the windings 305 and 306 efficiently generate and absorb power into or out of the flywheel storage by use of separate rectifier-converter bridges 332 and 333.

In some embodiments of the system 300 where fast control of output pulsing waveforms is needed or desired, a PFN excitation circuit 330 can also be charged by the DFIM 302 in modes where fast excitation is not required or in the initial startup mode, since the stator tertiary winding 307 is bidirectional. A separate polyphase rectifier 329 derived from using the tertiary winding-induced voltage (when not in a pulsing output duty) is configured to charge the battery or ultra-capacitor bank subsystem 328, which subsequently charges three sets of capacitors in the PFN excitation circuit 330. When the DFIM 302 is at its upper speed range, the DFIM 302 is most efficient in charging the battery or ultra-capacitor bank subsystem.

The main output of the DFIM 302 is the secondary winding 305, which is a polyphase stator winding with high galvanic isolation from the other stator windings 303, 304, 306, 307, although the secondary winding 305 is built on the same stator core as the windings 303, 304, 306, 307. Although the windings 303-307 may appear segregated in certain peripheral zones in FIGS. 3A and 3B, in practice each winding 303-307 is a distributed winding around the machine periphery. The windings 305-307 may be wound in alternate stator slots. The windings 303 and 304 may be wound in upper and lower portions of the same stator slots. In some embodiments, the winding 305 is a higher-voltage winding than the others and is connected through a system of vacuum interrupters 336 into a forward phase delay bridge 332. The switching elements for the bridge 332 may include thyristors, insulated gate bipolar transistors (IGBTs), integrated gate commutated thyristors (IGCTs), MOS-controlled thyristors (MCTs), or other solid-state switching devices with high voltage blocking ability. The switching elements also provide short circuit protection to the entire main output. The vacuum interrupters 336 can also serve as short circuit protection.

Figure 3C:
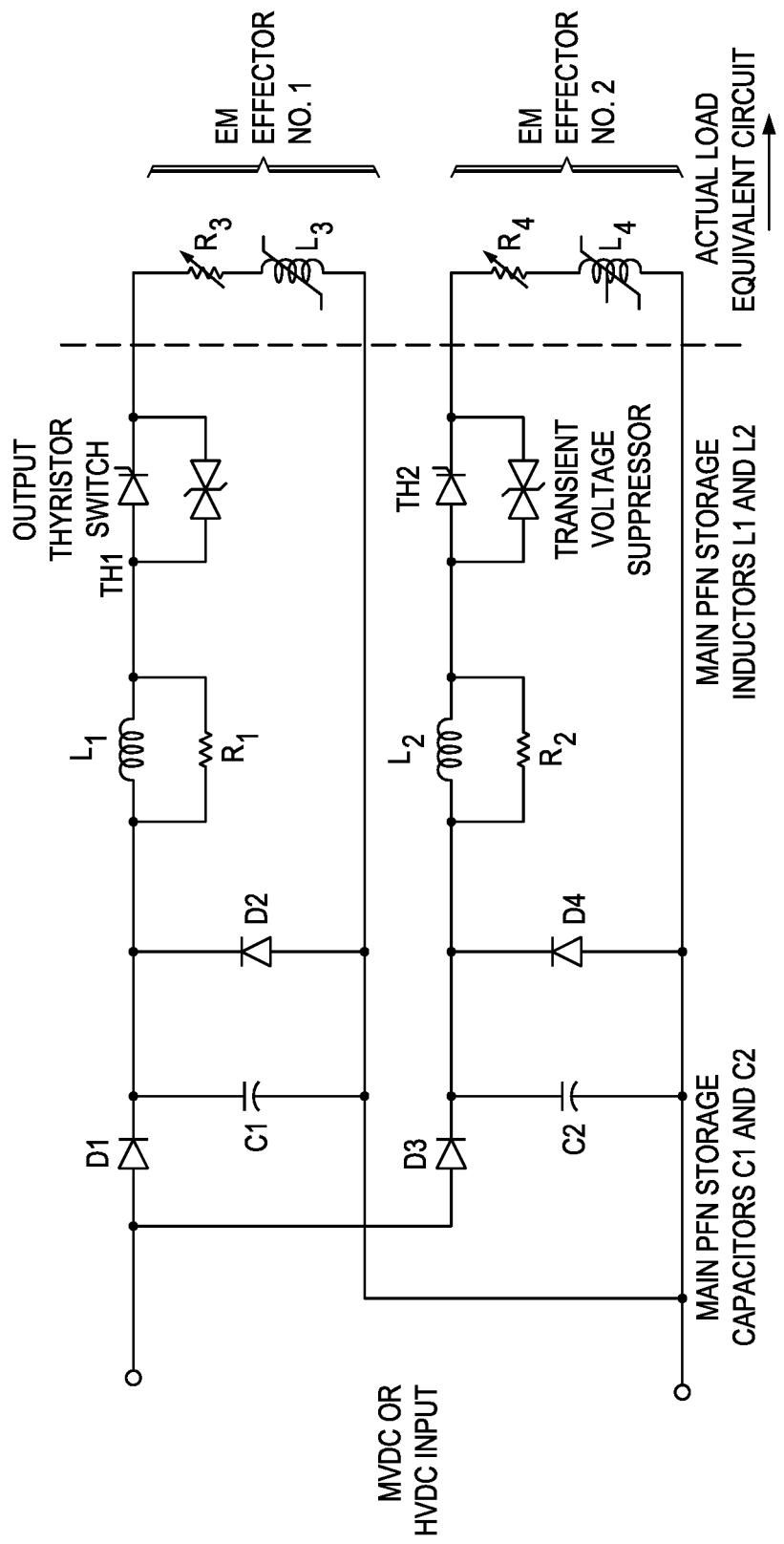
FIG. 3C illustrates a pulse forming network (PFN) pulsed load circuit that can be used for various loads.

The output of the bridge 332 is connected to multiple pulsed loads 334 and 335, which may be medium DC voltage or high DC voltage pulsed loads. By varying the thyristor phase angle delay, the output power is controlled to produce either a constant-voltage output or a constant-current output. The embodiments of this disclosure allow for sequential discharge or firing of the pulsed loads 334 and 335. Note that the output loads may actually include numerous loads (such as hundreds of modules) without restriction, and these modules can be grouped together into simultaneous firing groups with particular groups being sequentially fired. FIG. 3C illustrates a PFN pulsed load circuit that can represent the pulsed loads 334 and 335 of FIGS. 3A and 3B or the pulsed load 234 of FIGS. 2A and 2B.

In some embodiments, the converter bridges 332 and 333 form a dual power converter system with fully bidirectional power flow. However, reverse power from a pulsed load is directed to the separate polyphase stator winding 306 through the reverse converter bridge 333. Situations may arise when the MVDC or HVDC power from the pulsed load 334 and 335 (which may include a large capacitor storage bank) cannot be used or dissipated in its intended use. Consequently, this energy is absorbed or transferred much faster in a flywheel energy storage 308 than the turbine generators or battery can accept. The stator winding 306 can be designed for slightly lower voltage or flux/pole rating than the winding 305. In doing so, this allows a more efficient transfer of load output energy to the DFIM 302 and hence rapid energy transfer to the flywheel energy storage 308 as a sink.

Although FIGS. 3A and 3B illustrate another example of a hybrid energy storage system 300, various changes may be made to FIGS. 3A and 3B. For example, the makeup and arrangement of the system 300 are for illustration only. Components could be added, omitted, combined, or placed in any other configuration according to particular needs.

Figure 4:
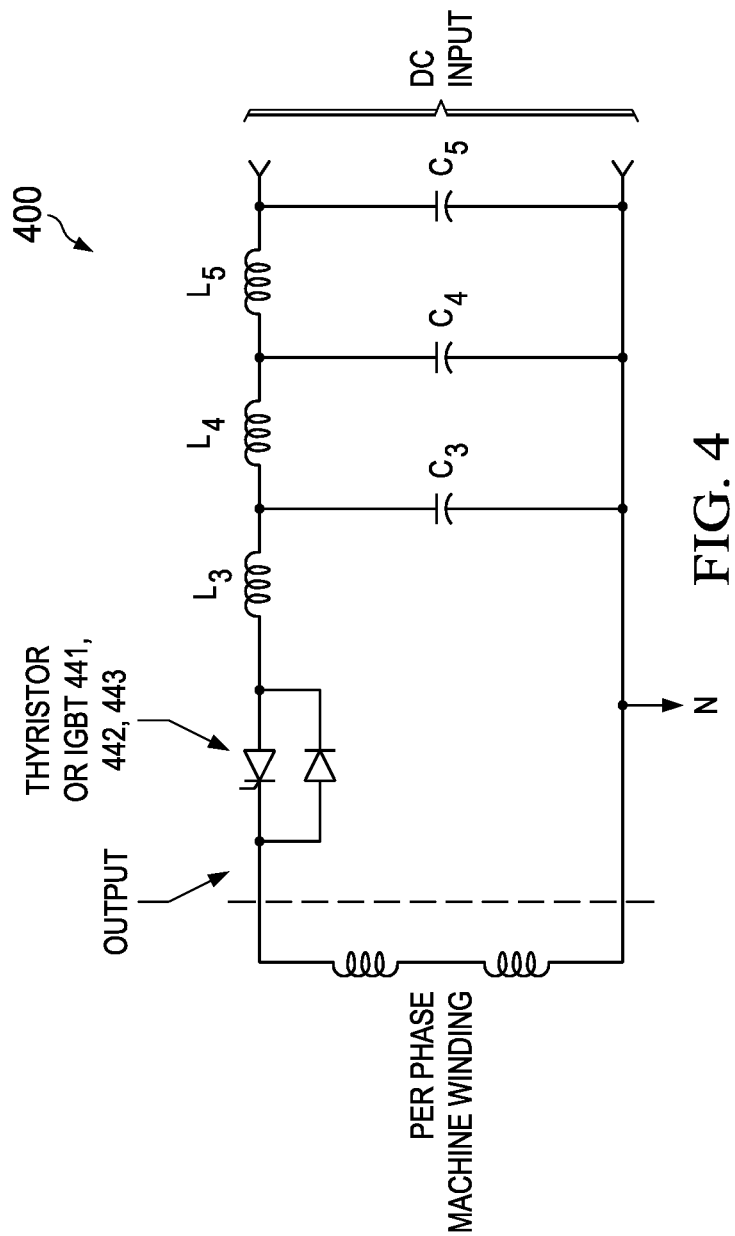
FIG. 4 illustrates an example PFN excitation circuit for tertiary machine windings per phase according to this disclosure.

FIG. 4 illustrates an example PFN excitation circuit 400 for tertiary machine windings per phase according to this disclosure. The PFN excitation circuit 400 (or portions thereof) could be incorporated into (or used in conjunction with) the system 200 of FIGS. 2A-2B, the system 300 of FIGS. 3A-3B, or any other system.

As shown in FIG. 4, the PFN excitation circuit 400 is a three-stage PFN with output switches 441-443. The output switches 441-443 could be IGBT or thyristor switches with 100 kHz or greater switching frequency, although other switches could be used. Representative values for the PFN components in FIG. 4 could include:

$C3=C4=C5=10$ mF $L3=L4=L5=10$ μH

IGBT/diode pair: INFINEON IGBT/diode pair (such as part no. FZ1200R45HL3) rated at 4500V, 1200A One example use of the PFN excitation circuit 400 is to create a quasi-sinusoidal current waveform into the tertiary winding and to have the three solid-state switches triggered about 120° apart at whatever frequency is chosen. This creates a rapid response traveling wave of excitation, which is used for electrical machine excitation. Referring again to FIGS. 3A and 3B, independent of the machine shaft speed, the output voltage on the secondary windings 305 and 306 can rise rapidly (such as within microseconds) once the current in the tertiary winding 307 is established. In some embodiments, the tertiary winding 307 has a minimum inductance in order to maximize the rate of rise of excitation current or maximize dv/dt and thus minimize the output pulse rise time.

Although FIG. 4 illustrates one example of a PFN excitation circuit 400, various changes may be made to FIG. 4. For example, while FIG. 4 shows a three-stage PFN, this is merely one example. The PFN excitation circuit 400 can have more than three or fewer than three stages. Also, the makeup and arrangement of the PFN excitation circuit 400 are for illustration only. Components could be added, omitted, combined, or placed in any other configuration according to particular needs.

FIG. 5 illustrates example waveforms 501-503 for PFN excitation of the tertiary winding with three-phase triggered switches and 120° offset between each wave, according to this disclosure. The waveforms 501-503 could, for example, be used by the PFN excitation circuit 400 of FIG. 4 in the systems 200, 300.

In this example, FIG. 5 shows the waveforms 501-503 created by a PFN-type excitation into a machine stator tertiary winding (such as the winding 307 of FIG. 3A). This creates a "traveling wave" of excitation of the machine magnetic flux, a very rapid rise of output pulsed power, and a decaying oscillation of applied excitation voltage (such as over seven cycles after the output switches 441-443, as thyristor devices, are triggered). In this example, the very rapid rise of output pulsed power occurs in an approximately 121 μs period time (about 8264 Hz frequency). After seven cycles, there is a pause period (such as on the order of seconds) for recharging the three sets of PFN circuit capacitors C3, C4, and C5 of FIG. 4. Then, the thyristor triggering occurs again to produce a second large output fast rise-time pulse.

Although FIG. 5 illustrates examples of waveforms for PFN excitation, various changes may be made to FIG. 5. For example, while FIG. 5 shows three waveforms from three switches, this is merely one example. The PFN excitation circuit can have more than three or fewer than three stages, resulting in more or fewer waveforms.

Figure 6A:
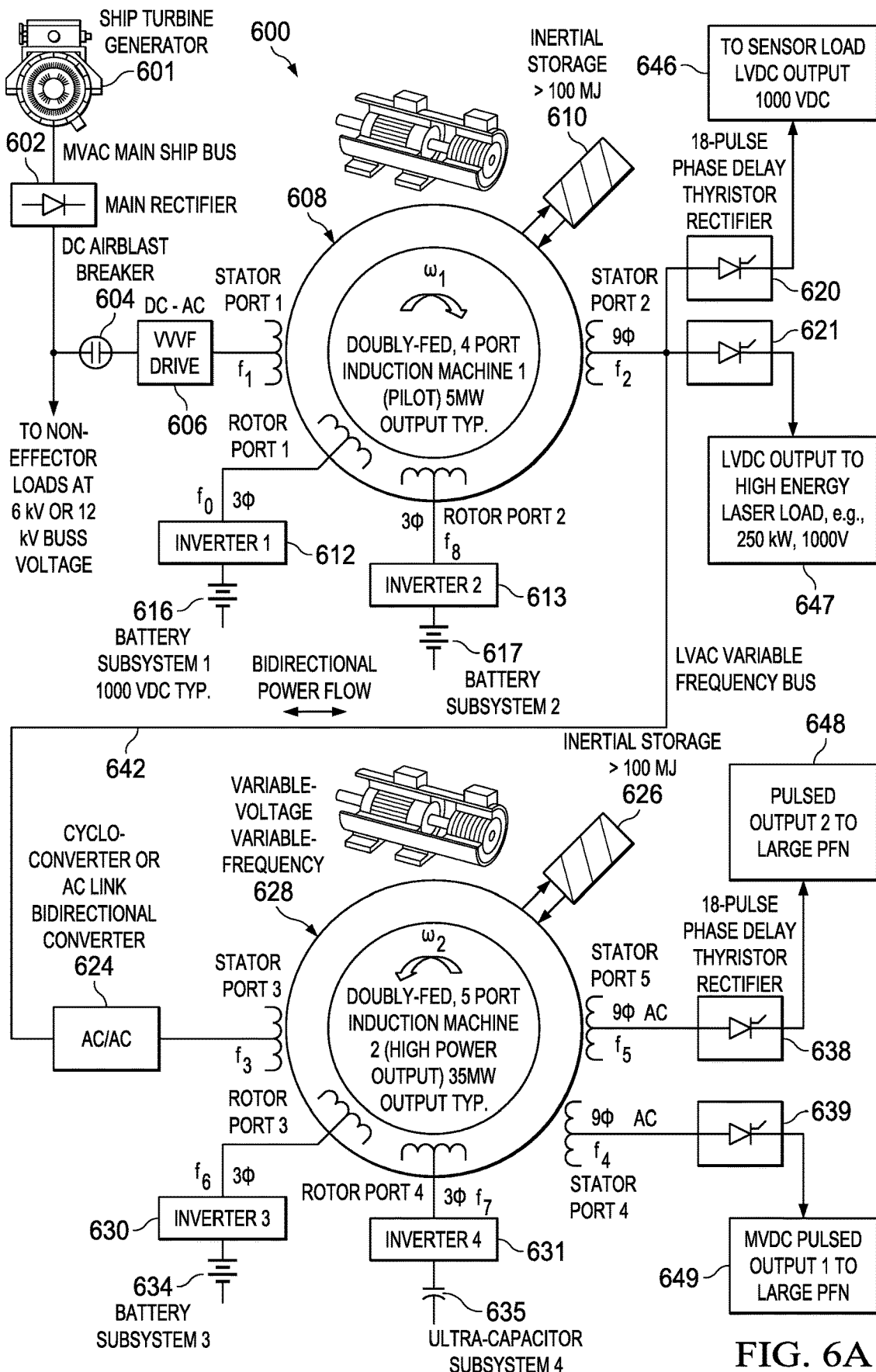
FIG. 6A illustrates an example cascade type hybrid energy storage system with sequential charging/discharging of multiple electrochemical or ultra-capacitor energy storage cells according to this disclosure.

FIG. 6A illustrates an example cascade type hybrid energy storage system 600 with sequential charging/discharging of multiple electrochemical or ultra-capacitor energy storage cells according to this disclosure. As shown in FIG. 6A, the system 600 includes a cascade arrangement of dual HESMs from an MVDC main distribution bus for powering multiple pulsed power loads, such as four loads 646-649 with four different types of power requirements, using multiple isolated battery energy storage subsystems. Two DFIMs 608 and 628 are arranged in a cascaded configuration and may be of the doubly-fed wound rotor type but may not be identical. Rather, the DFIM 608 can be a pilot machine (slave), and the DFIM 628 can be a higher output unit (master). The example in FIG. 6A shows DFIMs differing by a factor of 7:1 in power output. The DFIMs 608 and 628 can either operate in unison, thereby providing parallel output power to multiple ports, or operate sequentially, thereby providing main pulse power output.

Figure 6B:
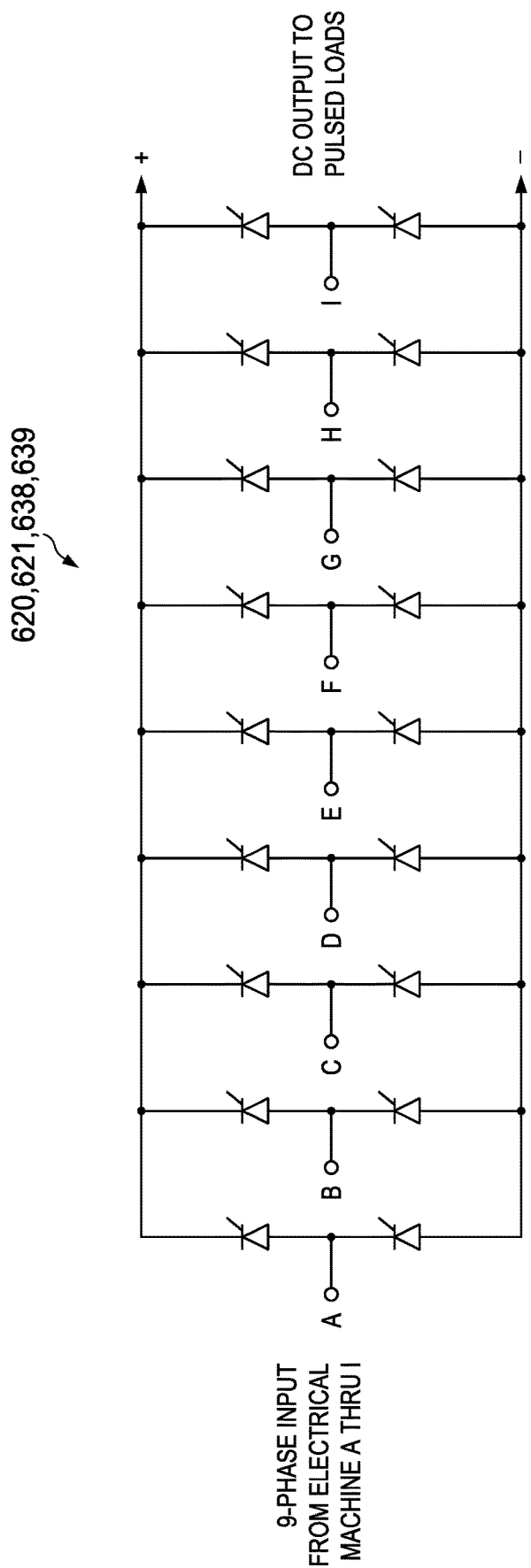
FIG. 6B illustrates an 18-pulse phase delay thyristor rectifier for powering the load circuits of FIG. 6A.

The system 600 serves both low-power and high-power pulsed loads and allows both DFIMs 608 and 628 to feed the loads simultaneously if desired. Each DFIM 608 and 628 has an inertial energy storage (such as a flywheel) 610 and 626 and multiple isolated stages of battery or ultra-capacitor energy storage. Each DFIM 608 and 628 is configured for both motor and generator modes of operation. A main power turbine generator set 601 feeds a main AC-to-DC rectifier 602 to create a medium voltage bus, which enters the HESM system through a DC airblast breaker 604 and is directed to a variable-voltage variable-frequency motor drive/converter 606. This feeds polyphase AC to the pilot DFIM 608 with the attached flywheel storage 610. The DFIM 608 has two rotor excitation ports, which are polyphase AC windings, and each powers a separate AC-to-DC converter/inverter 612 and 613 to power battery or ultra-capacitor subsystems 616 and 617, respectively. The pilot DFIM 208 has one stator output port, which is shown as a 9-phase AC port, directly connected to multiple output power electronic converters (rectifier/inverters) 620 and 621, which are also shown in FIG. 6B. The converters 620 and 621 power separate pulsed DC loads at either low voltage potential or relatively low power to the loads 646 and 647, which may include two or more electromagnetic effectors.

The stator output port also creates a low-voltage or medium-voltage variable-frequency "f2" bus 642 connected through an AC/AC converter 624 to stator port #3 of the DFIM 628, which is capable of higher power and higher inertial stored energy than the DFIM 608. The bus frequency f2 may be medium or high frequency and, if a high frequency is chosen, the converter 624 may be a standard cyclo-converter or AC link converter. The DFIM 628 has two isolated high power output ports #4 and #5, which could be high voltage 6-phase, 9-phase, or 12-phase windings, independently feeding output converters 638 and 639 (primarily for rectification). Attached to the converters 638 and 639 are pulsed medium-voltage or high-voltage loads 648 and 649. In some embodiments, there are nine principal frequencies within the system 600 as shown in Table 1.

TABLE 1

| Electrical Frequency ID | Location on FIG. 6 | Frequency |
| --- | --- | --- |
| f0 | Rotor Port 1 | Low frequency |
| f1 | Stator Port 1, DFIM 608 | Medium frequency |
| f2 | Stator Port 2, DFIM 608 + LV Bus | Medium or High Frequency |
| f3 | Stator Port 3, DFIM 628 | Medium Frequency |
| f4 | Stator Port 4, DFIM 628 | Medium or High Frequency |
| f5 | Stator Port 5, DFIM 628 | Medium or High Frequency |
| f6 | Rotor Port 3 | Low frequency |
| f7 | Rotor Port 4 | Low frequency |
| f8 | Rotor Port 2 | Low frequency |

Both converters 638 and 639 have independent voltage phase-back control and allow the effector loads to have different DC output voltages (if desired) or to be staggered in time while full build-up of voltage occurs. Thus, the output system allows sequential charging of multiple PFN loads 648 and 649, which could complement the charging scheme for a system of hundreds of PFNs used for a repetitive fire or fast response defensive system.

The DFIM 628 has two rotor input/output polyphase AC ports, which can be matched and are bidirectional in power flow, each being connected to an inverter 630 and 631 feeding a main energy battery subsystem 634 or ultra-capacitor subsystem 635. Thus, the system 600 has at least two battery/ultra-capacitor energy storage subsystems transferring energy with the pilot DFIM 608 and two or more battery/ultra-capacitor subsystems transferring energy (through a sequential charge and sequential discharge) with the high power DFIM 628. In some embodiments, some of the battery subsystems 616, 617, 634, 635 are at substantially different states of charge and have different internal impedances or electrical time constants. One example purpose of this arrangement could be to provide sequential use of the batteries in a repetitive fire mode in order to preserve battery operating life and enhance overall reliability as described below. The DFIMs 608 and 628 are able to accommodate the different states of charge by adjustment of the internal voltage of the DFIMs 608 and 628.

Although FIG. 6A illustrates one example of a hybrid energy storage system 600 with sequential charging/discharging of multiple electrochemical or ultra-capacitor energy storage cells, various changes may be made to FIG. 6A. For example, the makeup and arrangement of the system 600 are for illustration only. Components could be added, omitted, combined, or placed in any other configuration according to particular needs.

Figure 7B:
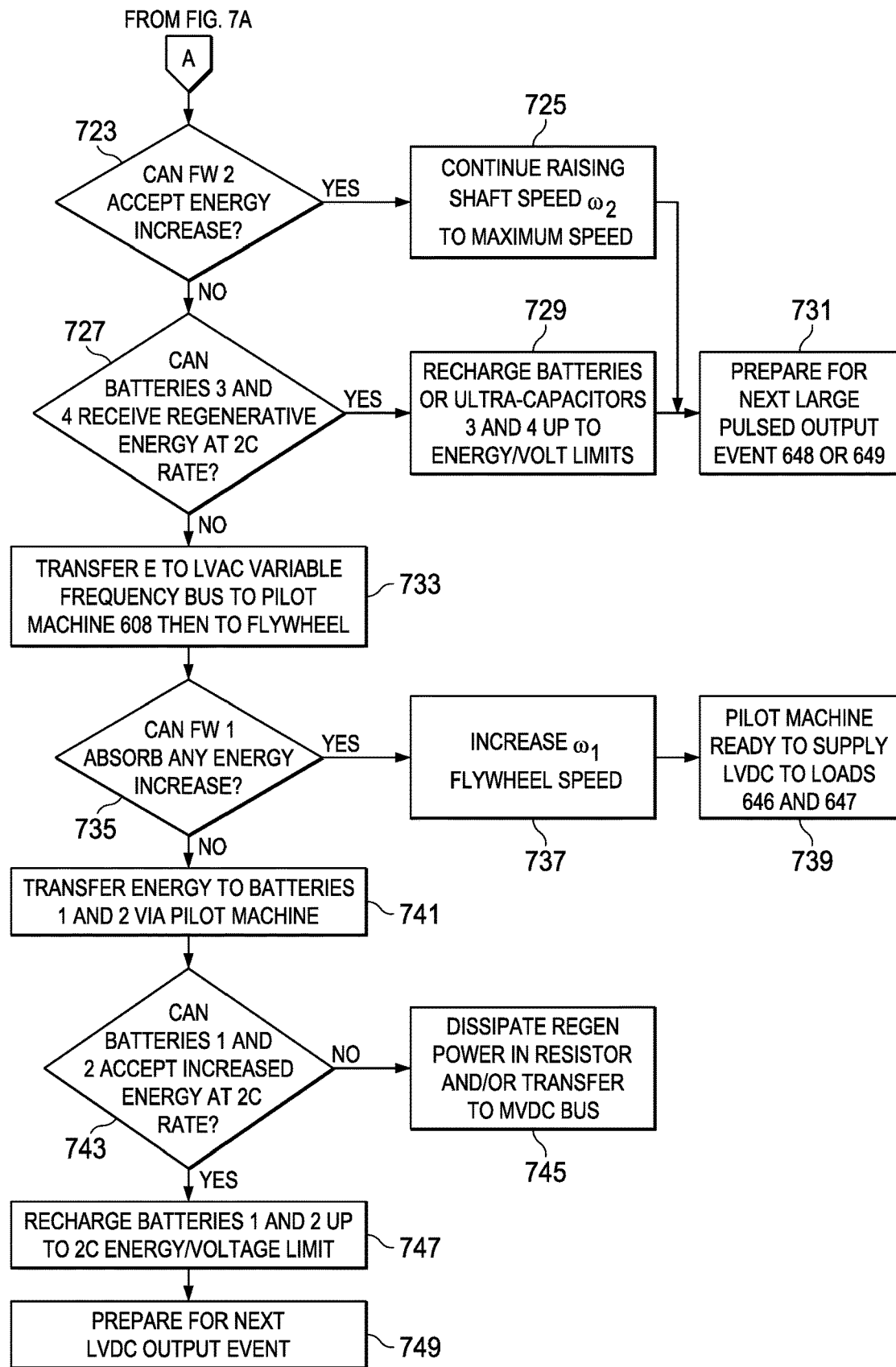

FIGS. 7A and 7B illustrate an example method 700 for operating a hybrid energy storage system according to this disclosure. For ease of explanation, the method 700 is described as being performed using the system 600 of FIG. 6A. However, the method 700 could be used with any other suitable device or system.

At step 701, the batteries 616, 617, 634, 635 are charged from the MVDC bus, and the pilot DFIM 608 is started using the converter 606 and the inverters 612 and 613 to control the motor slip frequency f0 to be less than f8. At step 703, the flywheel storage 610 is brought to the full rated energy level (maximum speed) with the DFIM stator output being an open circuit. At step 705, the converter 624 brings the master DFIM 628 and the flywheel 626 up to speed while drawing energy from the flywheel storage 610 and the main DC bus. The flip frequency f6, f7 of the DFIM 628 is regulated by the inverters 630 and 631.

At step 707, it is determined if an LVDC output is needed at the load 646. If the output is needed, the method 700 continues to step 709. If the output is not needed, the method 700 continues to step 711. At step 709, the converter 620 is excited to command output power, and the converter 606 is adjusted to increase the main energy to bring the flywheel storage 610 to maximum speed. At step 711, it is determined if an LVDC output is needed at the load 647. If the output is needed, the method 700 continues to step 713. If the output is not needed, the method 700 continues to step 715. At step 713, the converter 621 is excited to command output power, and the converter 606 is adjusted to increase the main energy to bring the flywheel storage 610 to maximum speed.

Step 715 includes multiple steps 715a-715c that can be performed simultaneously or sequentially. In each step 715a-715c, it is determined if energy is needed. In particular, at step 715a, it is determined if a large energy LVDC output is needed at the load 648. If the output is not needed, the method 700 continues to a standby mode in step 717. If the output is needed, the method 700 continues to step 719a. At step 715b, it is determined if a large energy LVDC output is needed at the load 649. If the output is not needed, the method 700 continues to the standby mode in step 717. If the output is needed, the method 700 continues to step 719b. At step 715c, it is determined if an energy recovery is needed from the pulsed load on the PFN bank. If the energy recovery is not needed, the method 700 continues to the standby mode in step 717. If the output is needed, the method 700 continues to step 719c.

At step 719a, the gates to the converters 638 are triggered. At step 721a, the method 700 returns to step 715 to repeat the cycle multiple times before recharging the flywheel 626. At step 719b, the gates to the converters 639 are triggered. At step 721b, the method 700 returns to step 715 to repeat the cycle multiple times before recharging the flywheel 626. At step 719c, the gates to the converters 638 and 639 are triggered for regenerative power flow.

At step 723, it is determined if the flywheel 626 can absorb an energy increase. If the increase is possible, the method 700 continues to step 725, where the shaft speed of the flywheel 626 continues to increase to the maximum speed. If the increase is not possible, the method 700 continues to step 727. At step 727, it is determined if the batteries 634 and 635 can receive regenerative energy at a nominal (1C) or twice-nominal (2C) rate. If the batteries 634 and 635 can receive regenerative energy at 2C rate, the method 700 continues to step 729. If the batteries 634 and 635 cannot receive regenerative energy at 2C rate, the method 700 continues to step 733.

At step 729, the batteries 634 and 635 are regenerated up to their energy or voltage limits. Later, at step 731, the batteries 634 and 635 prepare for the next large pulsed output at the loads 648 and 649. At step 733, energy is transferred to the LVAC variable frequency bus, to the pilot DFIM 608, and to the flywheel storage 610. At step 735, it is determined if the flywheel storage 610 can absorb an energy increase. If the increase is possible, the method 700 continues to step 737. If the increase is not possible, the method 700 continues to step 741. At step 737, the shaft speed of the flywheel storage 610 is increased. Later, at step 739, the DFIM 608 can supply LVDC to the loads 646 and 647. At step 741, energy is transferred to the batteries 616 and 617 via the DFIM 608.

At step 743, it is determined if the batteries 616 and 617 can accept increased energy at 2C rate. If the batteries 616 and 617 cannot accept increased energy at 2C rate, the method 700 continues to step 745. If the batteries 616 and 617 can accept increased energy at 2C rate, the method 700 continues to step 747. At step 745, regenerative power in the resistor is dissipated, and/or power is transferred to the MVDC bus. At step 747, the batteries 616 and 617 are recharged up to the 2C energy or voltage limit. Later, at step 749, the batteries 616 and 617 prepare for the next LVDC output event.

Although FIGS. 7A and 7B illustrate one example of a method 700 for operating a hybrid energy storage system, various changes may be made to FIGS. 7A and 7B. For example, while shown as a series of steps, various steps shown in FIGS. 7A and 7B could overlap, occur in parallel, occur in a different order, or occur multiple times. Moreover, some steps could be combined or removed and additional steps could be added according to particular needs.

Figure 8A:
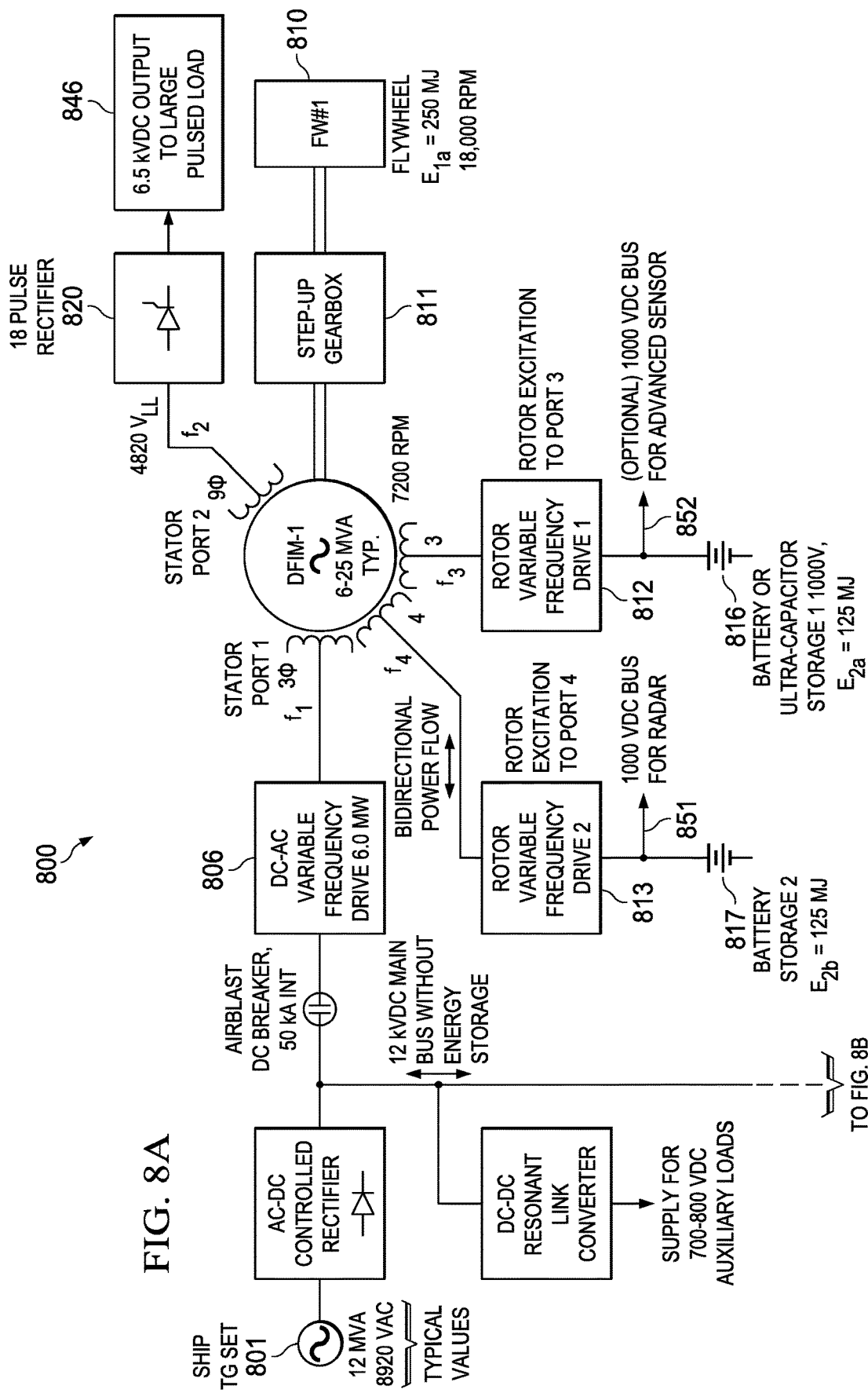
FIGS. 8A and 8B illustrate an example hybrid energy storage system with multiple battery systems according to this disclosure.
Figure 8B:
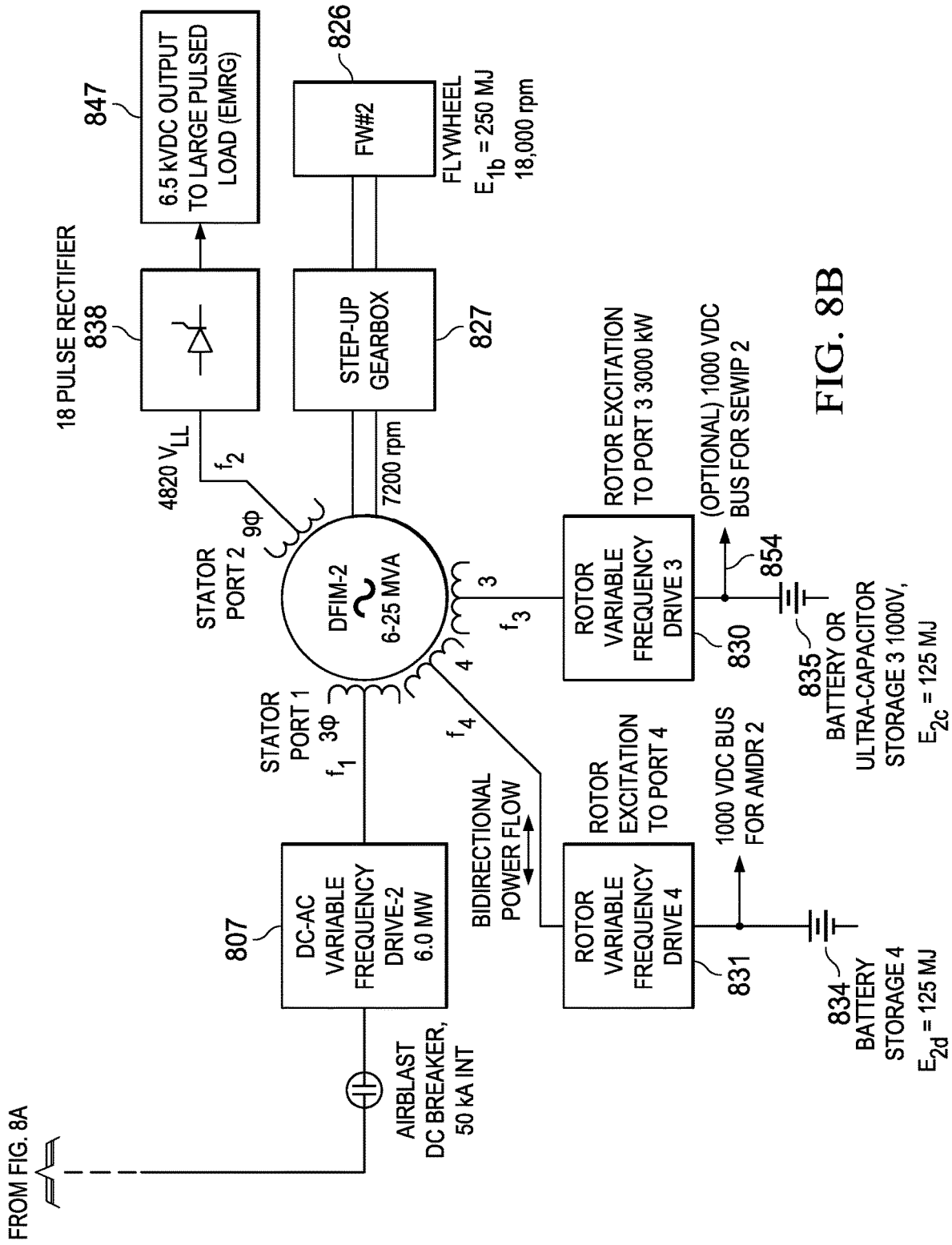

FIGS. 8A and 8B illustrate an example hybrid energy storage system 800 with multiple battery systems according to this disclosure. The system 800 is similar to the system 600 of FIG. 6A and includes many components in common with the system 600. A detailed description of those components will not be repeated here.

As shown in FIGS. 8A and 8B, the system 800 also includes power taps 851-854 that are coupled directly to battery subsystems 816, 817, 834, 835 for extraction of low-voltage DC power without the use of a DFIM electrical machine, limiting the stator high voltage output ports to one per DFIM machine. Also, step-up gearboxes 811 and 827 have been added. Converters 806 and 807 are bidirectional, which permits energy to be transferred from flywheel storage 810 and 826 and battery subsystem 816, 817, 834, 835 back to a turbine generator set 801 in small or large increments. Alternatively, the energy can be transferred into a ship auxiliary load situated on the MVDC bus.

The battery subsystems 816, 817, 834, 835 may be different. That is, each may have different voltage, resistance, or aging properties. In some cases, one or more of the battery subsystems 816, 817, 834, 835 may include a battery, while one or more others of the battery subsystems 816, 817, 834, 835 may include an ultra-capacitor. The converters 806 and 807 may also be different or include different components in order to operate with the different battery subsystems 816, 817, 834, 835.

Although FIGS. 8A and 8B illustrate another example of a hybrid energy storage system 800, various changes may be made to FIGS. 8A and 8B. For example, while one power tap 851-854 is shown for each battery subsystem, other embodiments could include additional power taps. Also, the makeup and arrangement of the system 800 are for illustration only. Components could be added, omitted, combined, or placed in any other configuration according to particular needs.

Figure 9A:
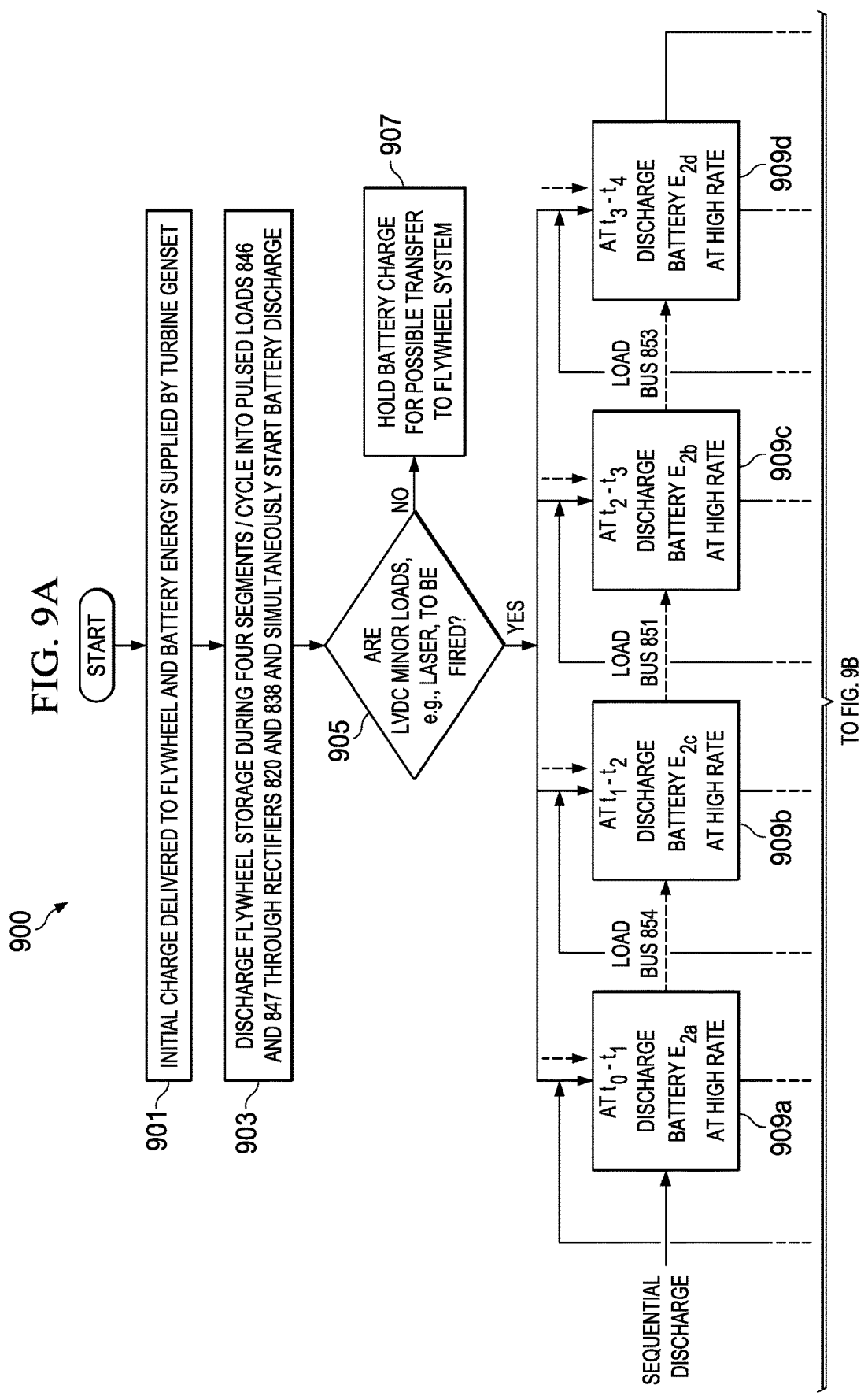
FIGS. 9A and 9B illustrate another example method for operating a hybrid energy storage system according to this disclosure.
Figure 9B:
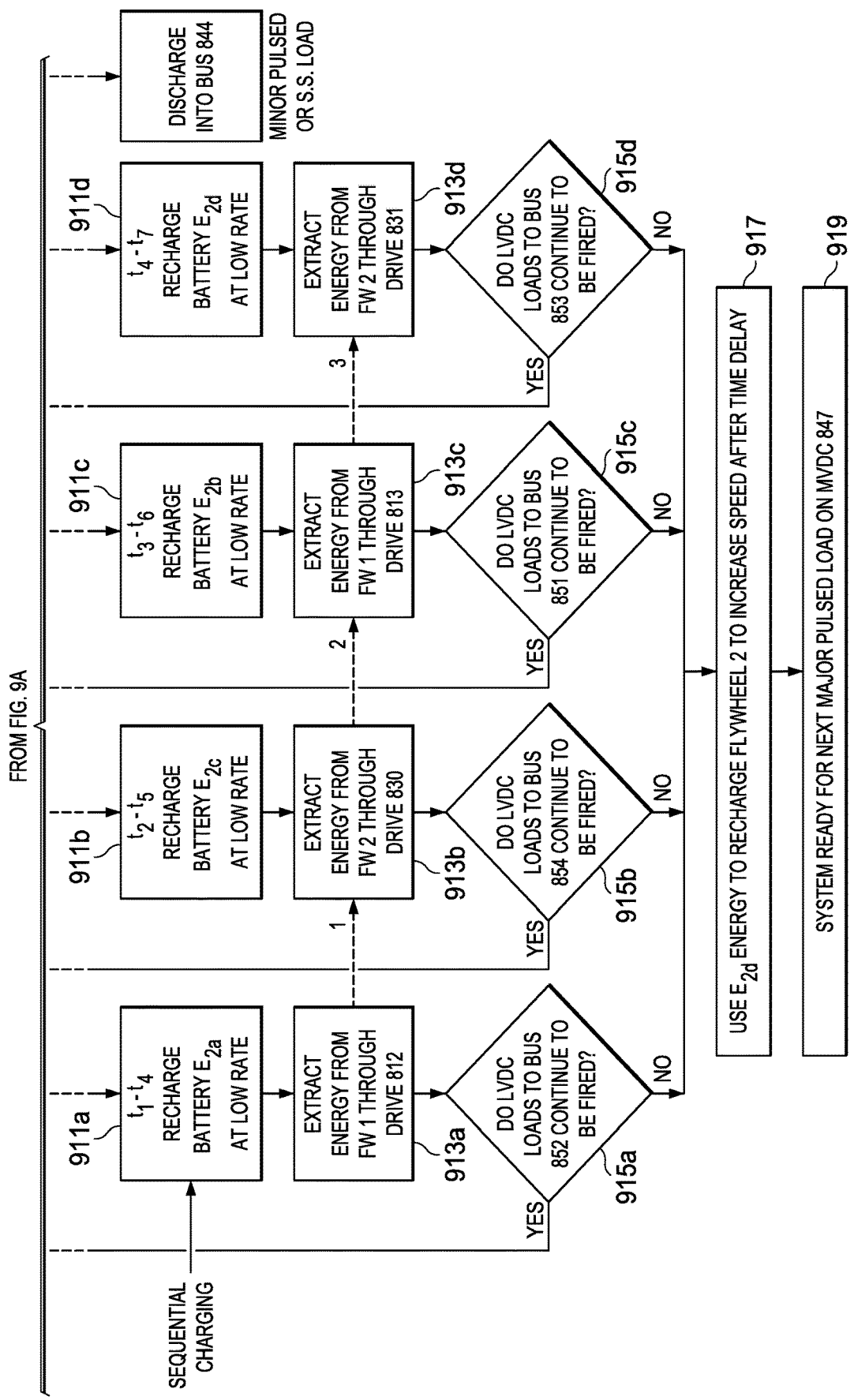

FIGS. 9A and 9B illustrate another example method 900 for operating a hybrid energy storage system according to this disclosure. For ease of explanation, the method 900 is described as being performed using the system 800 of FIGS. 8A and 8B. However, the method 900 could be used with any other suitable device or system.

At step 901, an initial charge is delivered to one or both flywheel storages 810 and 826 and battery energy is supplied by the turbine generator set 801. At step 903, energy stored in the flywheel storages 810 and 826 is discharged during four segments per cycle into the pulsed loads 846 and 847 through the converters 820 and 838, while discharge of the batteries is simultaneously started. At step 905, it is determined if there are one or more LVDC minor loads (such as a laser) to be fired. If there are not LVDC loads to be fired, the method 900 continues to step 907. If there are LVDC loads to be fired, the method continues to step 909. At step 907, the battery charge is held for possible transfer to the flywheel system.

Step 909 includes multiple steps 909a-909d that typically are performed sequentially, although two or more of the steps 909a-909d can be performed simultaneously. At each step 909a-909d, one of the batteries 816, 817, 834, 835 is discharged at a high rate. The discharged energy may be discharged into the bus. Step 911 also includes multiple steps 911a-911d that typically are performed sequentially, although two or more of the steps 911a-911d can be performed simultaneously. At each step 911a-911d, one of the batteries 816, 817, 834, 835 is recharged at a low rate.

Step 913 includes multiple steps 913a-913d that typically are performed sequentially, although two or more of the steps 913a-913d can be performed simultaneously. At each step 913a-913d, energy is extracted from one of the flywheels 810 and 826 through one of the inverters 812, 813, 830, 831. Step 915 also includes multiple steps 915a-915d that typically are performed sequentially, although two or more of the steps 915a-915d can be performed simultaneously. At each step 915a-915d, it is determined if LVDC loads to the power taps 851-854 continue to be fired. If the loads continue to be fired, the method 900 returns to step 909. Otherwise, the method 900 proceeds to step 917. At step 917, energy from the battery 834 is used to recharge (increase the speed of) the flywheel 826 after a time delay. Later, at step 919, the system is ready for the next major pulsed load at the load 847.

Although FIGS. 9A and 9B illustrate one example of a method 900 for operating a hybrid energy storage system, various changes may be made to FIGS. 9A and 9B. For example, while shown as a series of steps, various steps shown in FIGS. 9A and 9B could overlap, occur in parallel, occur in a different order, or occur multiple times. Moreover, some steps could be combined or removed and additional steps could be added according to particular needs.

Figure 10:
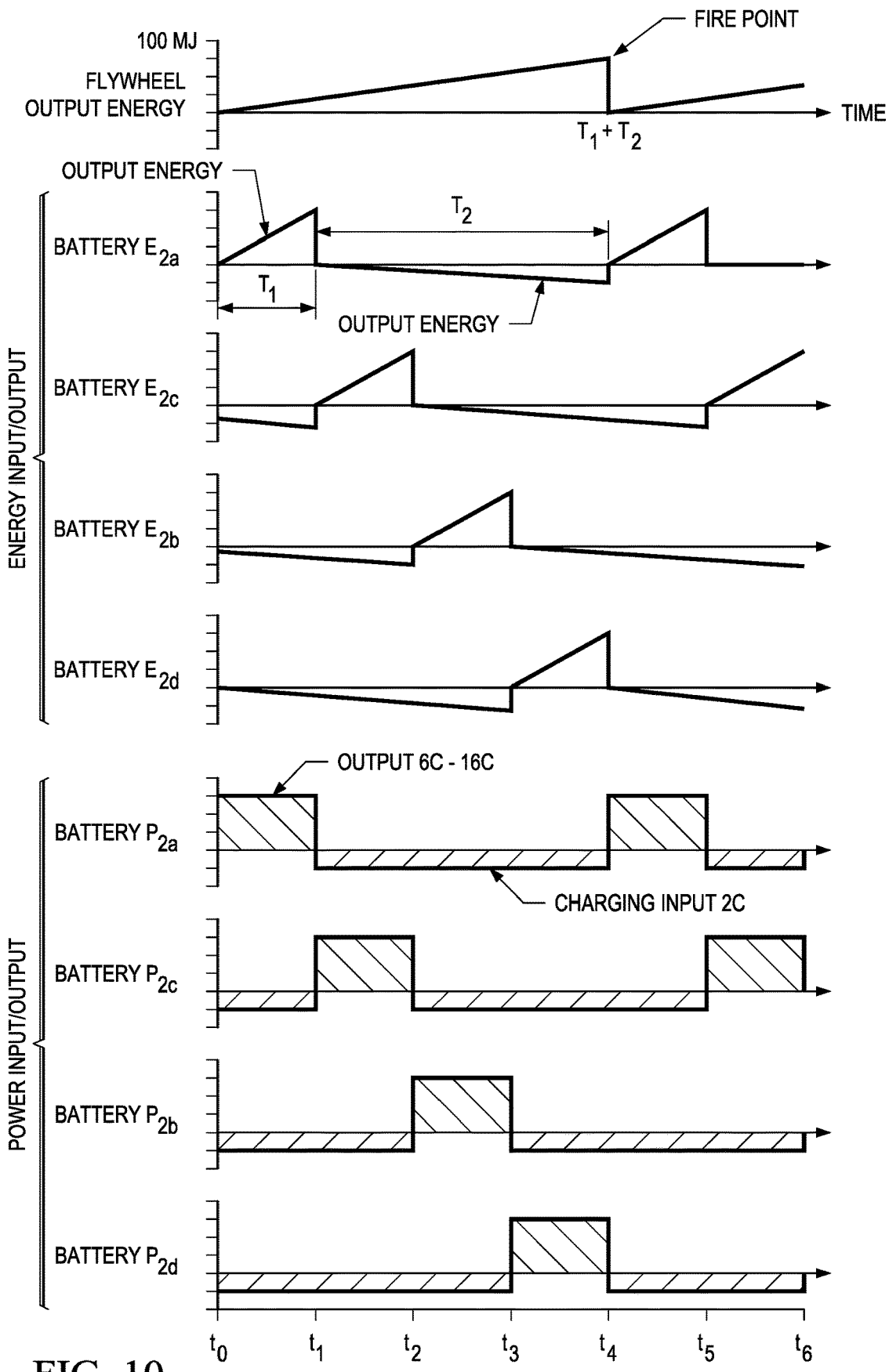
FIG. 10 illustrates an example technique for charging and discharging multiple battery or ultra-capacitor subsystems according to this disclosure.

FIG. 10 illustrates an example technique for charging and discharging multiple battery or ultra-capacitor subsystems according to this disclosure. The battery or ultra-capacitor subsystems are sequentially charged and sequentially discharged according to limit rates. Examples can include a 2C charge rate and a 6C discharge rate with a two-machine system. If a four-machine system is used, the battery charge rate could be 2C, and the discharge rate could be 12C. If a 6-machine system is adopted, the charge rate could be limited to 2C, but the discharge rate could increase to 16-18C.

As shown in FIG. 10, charging energy increases in a linear fashion with time, although sequential charging and discharging can be applied to batteries or ultra-capacitors that have non-linear energy versus time characteristics. Limiting the charging to a 2C rate could be needed or desired in view of state-of-the-art batteries that limit charging rates to about 2C due to chemical properties (often irrespective of discharge rate) to preserve lifetime and number of cycles before degradation. Of course, changes in battery technology could alter or eliminate limitations on charging rate. With a control scheme for a doubly-fed induction machine and characteristics of the inverters 612, 613, 630, 631 in FIGS. 6A and 6B, this provides for constant charging power and constant discharging power as shown in FIG. 10. Moreover, the systems 600 and 800 shown in FIGS. 6A and 6B and FIGS. 8A and 8B allow sequential thermal loading of the two electrical machines amongst the four rotor ports.

Although FIG. 10 illustrates one example technique for charging and discharging multiple battery or ultra-capacitor subsystems, various changes may be made to FIG. 10. For example, while energy and power for four batteries are depicted in FIG. 10, other embodiments could include more or fewer batteries or ultra-capacitor subsystems.

Figure 11A:
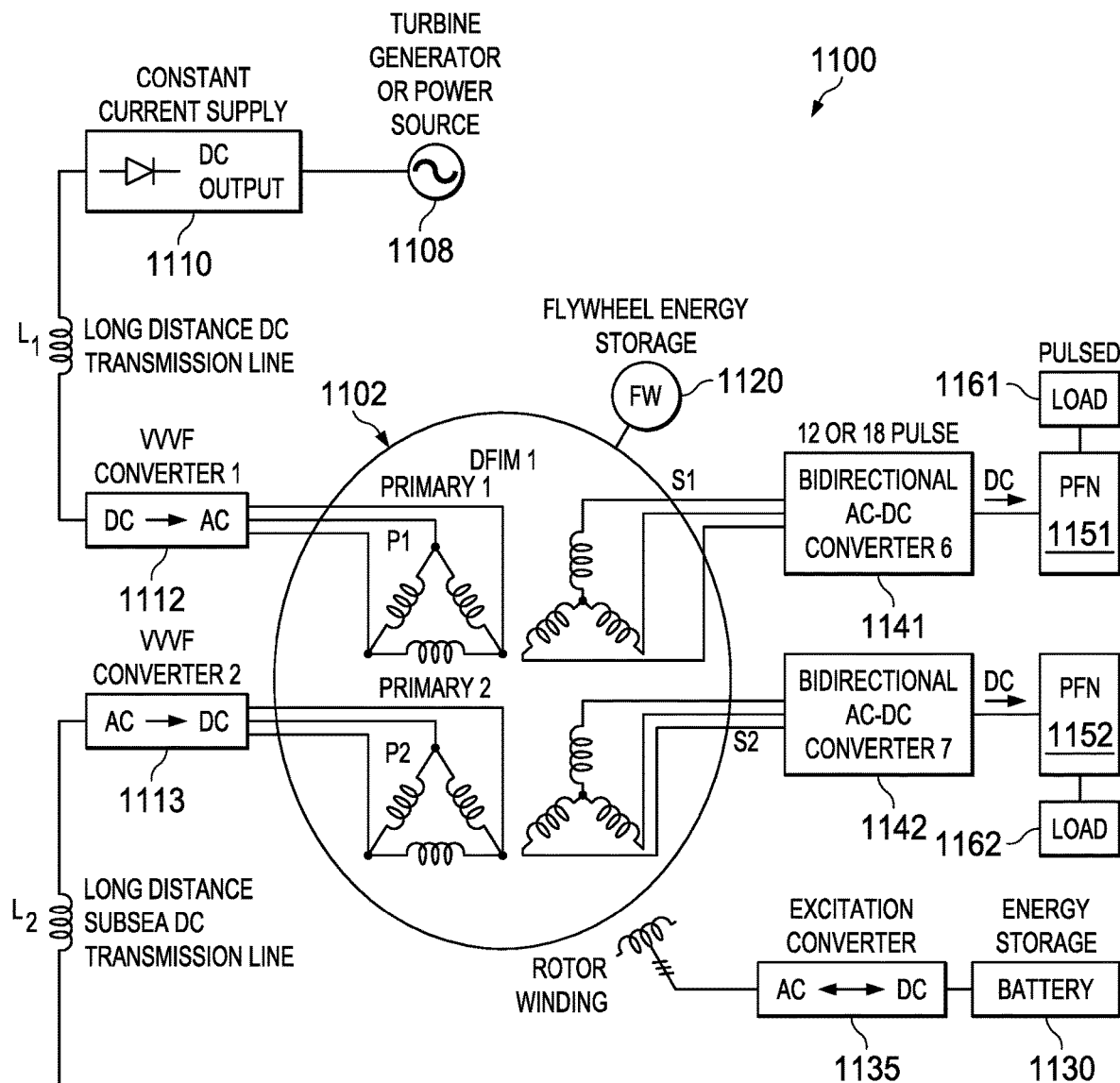
FIGS. 11A and 11B illustrate an example hybrid energy storage system with constant DC current input according to this disclosure.
Figure 11B:
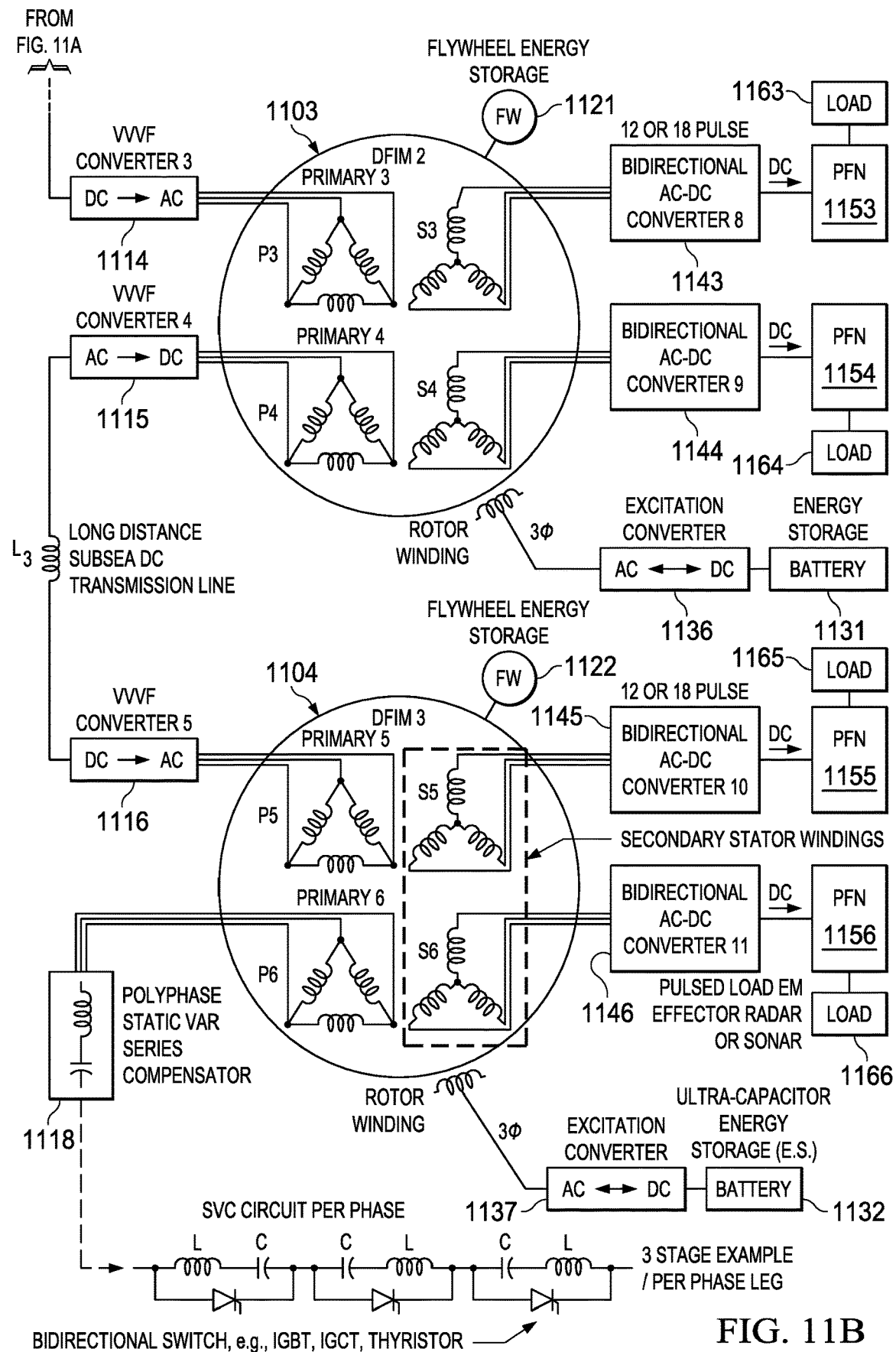

FIGS. 11A and 11B illustrate an example hybrid energy storage system 1100 with constant DC current input according to this disclosure. The system 1100 includes many components that are the same as or similar to components disclosed in earlier figures. A detailed description of those components will not be repeated here.

As shown in FIGS. 11A and 11B, the system 1100 includes an array of DFIMs 1102-1104. The input source is an AC turbine generator 1108, which is immediately rectified and regulated to yield a constant DC-current output 1110 for transmission, possibly over a long distance (e.g., ten miles or more), to converters and rotating machinery forming a pulsed power system. The first segment of the DC transmission line feeds a VVVF converter 1112 connected to a primary winding P1 of the DFIM 1102. The primary winding P1 could represent a delta connection.

One feature of the system 1100 is that all primary windings of the DFIMs 1102-1104 can be connected in series, and each DFIM 1102-1104 has multiport primary windings. In each DFIM 1102-1104, one primary winding P1, P3, P5 is electrically isolated (high-voltage insulated) from the other primary winding P2, P4, P6 but magnetically coupled to each other through a common induction type rotor. Pairs of primary windings P1 and P2, P3 and P4, and P5 and P6 are motoring windings and are capable of transmitting real power from the main AC turbine generator 1108 to a corresponding flywheel energy storage 1120-1122 or to another energy storage 1130-1132. The primary winding P1 is wound in a bifilar fashion that yields the P2 current (going to the DFIM 1103) as substantially equal to the input current in P1. Similarly, the primary winding P3 in the DFIM 1103 is wound in a bifilar fashion that yields the P4 current (going to the DFIM 1104) as substantially equal to the input current in P3.

This series but electrically isolated arrangement exists for the various machines in the master DC loop. The primary winding P2 is connected to a VVVF converter 1113, which converts a medium frequency machine constant magnitude AC current to DC constant current for transmission. This DC current is converted by a VVVF converter 1114 into a VVVF AC for input to the primary winding P3 of the DFIM 1103. Similarly, the output of the primary winding P4 is connected to a VVVF converter 1115, which converts a medium frequency machine constant magnitude AC current to a DC constant current for transmission. This DC current is converted by a VVVF converter 1116 into a VVVF AC for input to the primary winding P5 of the DFIM 1104.

To help maintain the overall system 1100 at constant current under varying loads and to allow this scheme to operate over long distances, the primary winding P6 of the last DFIM 1104 in the master series loop is connected to a Static VAR (volt-ampere reactive) Compensator (SVC) 1118. For the system 1100, a polyphase SVC 1118 with series connection of each L-C stage could be used, although other SVCs may be used and are within the scope of this disclosure. Switching elements in the SVC 1118 can be solid state switches such as IGBTs, thyristors, or IGCTs, provided that these are rated for high voltage and current. In general, almost 100% of the real power (P) to the DFIM 1104 may be provided at the port for the primary winding P5 from the DC line, while 100% of the reactive power (Q) may be provided at the port for the primary winding P6. In some embodiments, each DFIM stage has its own SVC if especially long lines are in use in between the DFIMs 1102-1106.

Each DFIM 1102-1104 has a minimum of two secondary output ports, identified as S1-S6. The secondary output ports S1-S6 are electrically isolated from each other and from the primary windings P1-P6. Each secondary port S1-S6 feeds a high-order phase number (such as 12 pulse, 18 pulse or 24 pulse) AC-to-DC controlled rectifier converter 1141-1146, typically using high voltage thyristors for switching/rectification elements. These converters 1141-1146 produce a DC output that is fed to a corresponding PFN 1151-1156, which has both capacitive and inductive storage elements and also contains a high voltage trigger switch (such as a thyristor or IGCT) at its output. A load 1161-1166 attached to each PFN output 1151-1156 is a complex DC load having an inductive-resistive load, which is either pulsed or intermittent including random/stochastic loading. The load 1161-1166 may also be a non-linear load such that both resistive and inductive elements are changing as a function of time or as a function of current level. An example of such a complex load is a railgun effector.

Another feature of the system 1100 is that two outputs from the secondary output ports S1 and S2 (or S3 and S4 or S5 and S6 for the other machines) can fire the PFNs 1151-1152 in an alternating fashion (such as when each has a 50% duty cycle) so that the sum total of the currents produced by the secondary output ports S1 and S2 is constant. This helps to maintain regulation of a constant-current DC input in the master loop.

Each DFIM 1102-1104 also includes a wound rotor winding (which can be referred to as a tertiary winding) that powers an AC-to-DC excitation converter 1135-1137, which is attached to the energy storages 1130-1132 (such as a battery or ultra-capacitor energy storage subsystem). The rotor windings are excited by low frequency polyphase AC, which allows the DFIM output at the secondary output ports S1-S6 to be controlled in frequency, slip value, and current. This allows power to be extracted from the flywheel 1120-1122 or the energy storage 1130-1132 without having to take the full output energy from the source, thus buffering the source. When the system 1100 is in a heavy pulsed mode, the source supply can even be disconnected, and all of the output energy can be derived from the flywheel 1120-1122 and the energy storage 1130-1132 for a limited number of cycles before the input DC supply is reconnected to power up the flywheel 1120-1122 or energy storage 1130-1132.

Although FIGS. 11A and 11B illustrate one example of a hybrid energy storage system 1100 with constant DC current input, various changes may be made to FIGS. 11A and 11B. For example, while three DFIMs 1102-1104 are shown in series, the system 1100 could include more or fewer DFIMs. Also, the makeup and arrangement of the system 1100 are for illustration only. Components could be added, omitted, combined, or placed in any other configuration according to particular needs.

Figure 12A:
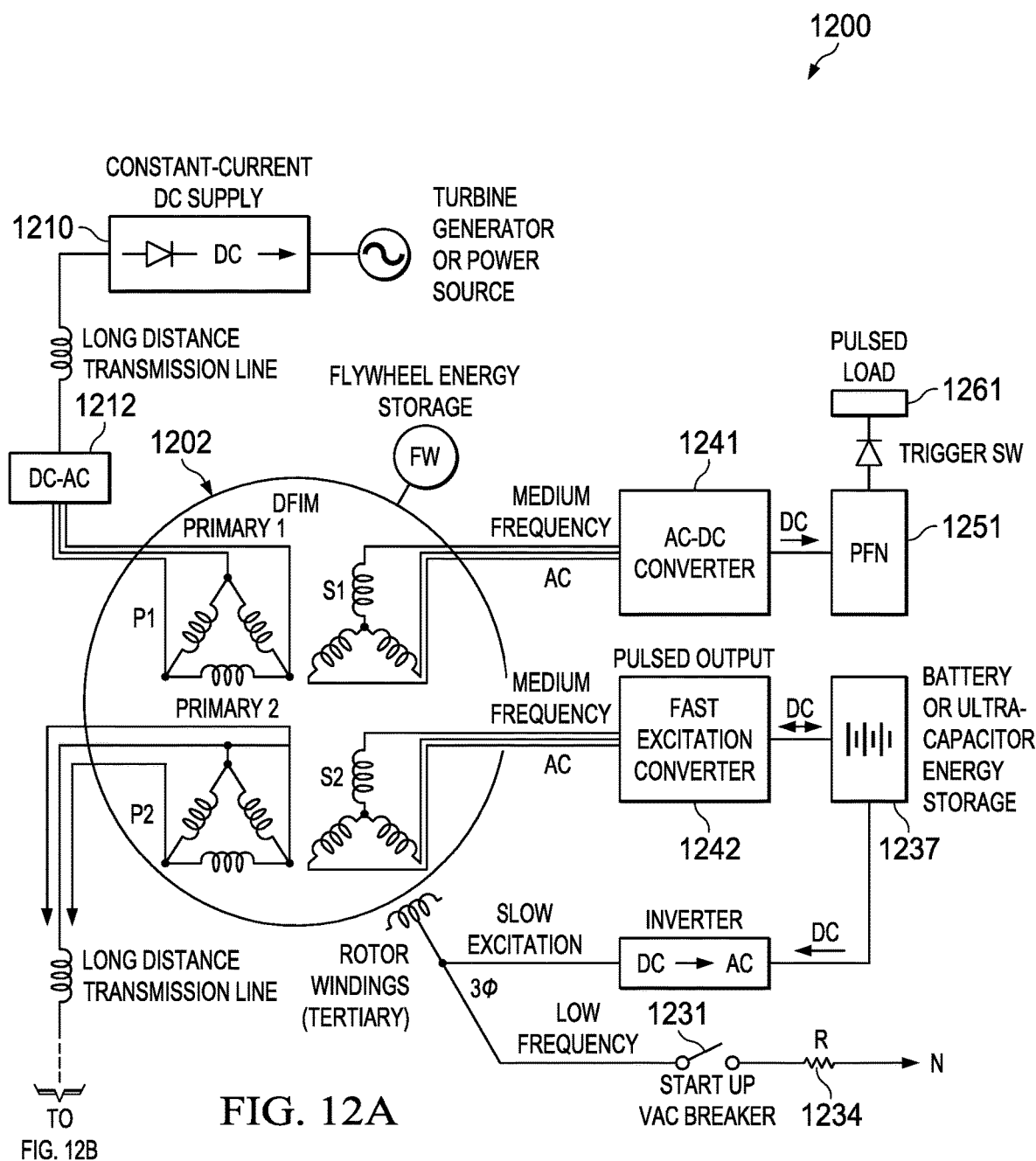
FIGS. 12A and 12B illustrate an example hybrid energy storage system with constant DC and constant-amplitude AC current input according to this disclosure.
Figure 12B:
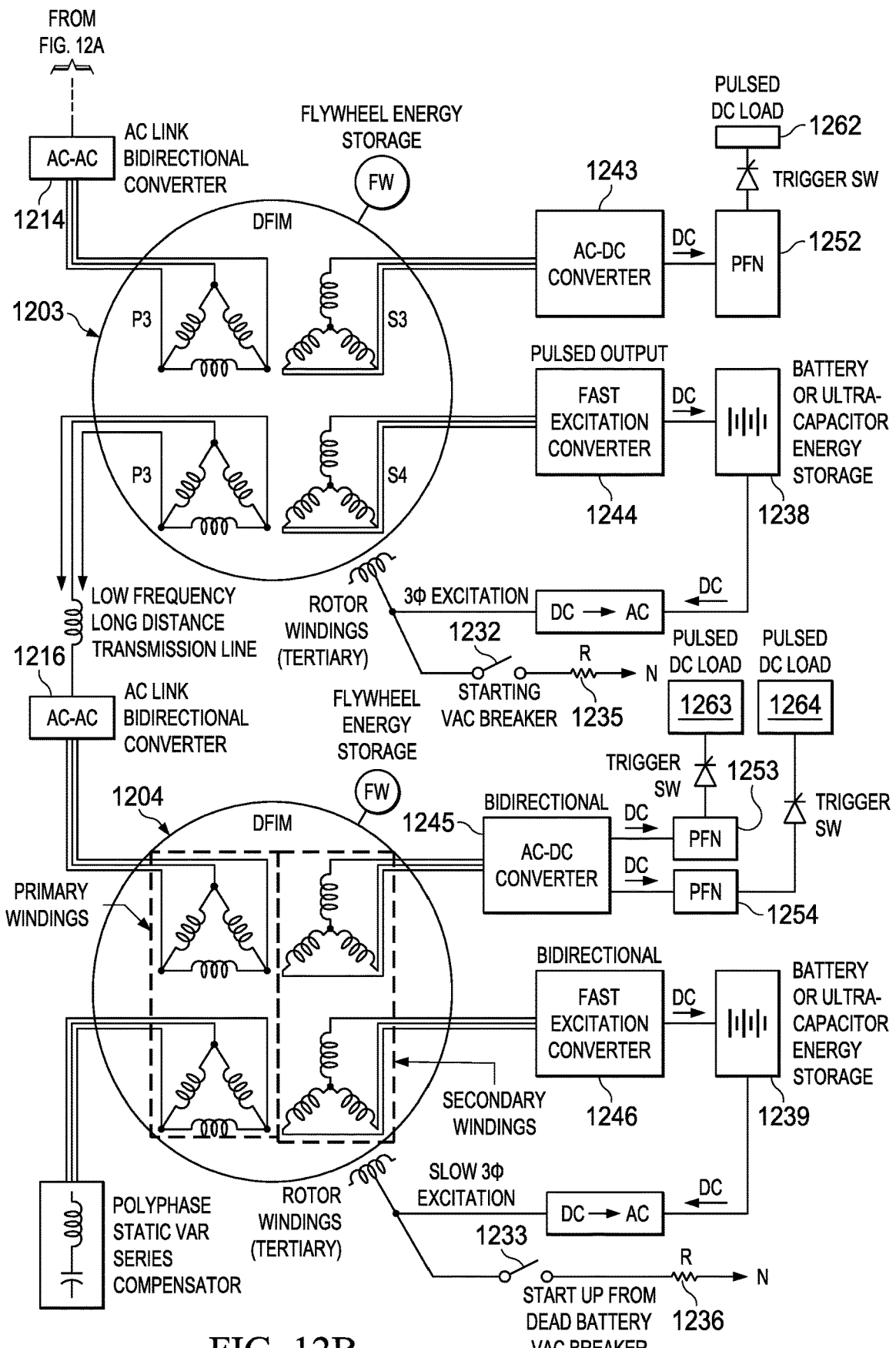

FIGS. 12A and 12B illustrate an example hybrid energy storage system 1200 with constant DC and constant-amplitude AC current input according to this disclosure. The system 1200 includes many components that are the same as or similar to components disclosed in earlier figures. A detailed description of those components will not be repeated here.

As shown in FIGS. 12A and 12B, the system 1200 includes a master loop that combines DC constant current and AC constant current low frequency between primary windings of DFIMs 1202-1204. The first transmission line constant-current DC 1210 is converted to a VVVF AC by a converter 1212, which is used as a motor drive that feeds a primary winding P1 at frequency f1. At the port for a primary winding P2 of the DFIM 1202, a low frequency (such as 0.5 Hz to 6 Hz) polyphase AC is "output," which is similar to the use of DC for a long transmission line, since the reactance voltage drops on line inductance is small and sometimes negligible.

AC-AC converters 1214-1216 are disposed between adjacent DFIMs 1202-1204. In some embodiments, each AC-AC converter 1214-1216 is an "AC link" converter, which provides excellent waveform quality (very low harmonics) compared to conventional DC-to-AC inverters and superior short circuit protection against device failure. In some embodiments, the output frequency f3 is lower than the input frequency f2 to the AC converter 1214. Similarly, the output frequency f5 of the AC converter 1216 is lower than its input frequency f4. The frequency f6 of the last DFIM 1104 can be arbitrary with respect to frequency f5.

Each DFIM 1202-1204 includes a (tertiary) rotor winding circuit for cold start-up of the system 1200. Each rotor winding circuit includes a polyphase vacuum breaker 1231-1233 and a polyphase resistor bank 1234-1236. At cold start, the rotor winding is connected to the resistor bank 1234-1236, which brings the rotor up to full speed without use of the battery or capacitor storage. During this start up, the secondary windings S1-S6 start generating enough voltage to charge the corresponding battery subsystem 1237-1239 for future use. The system 1200 also includes a fast excitation controller/inverter 1242, 1244, 1246 to feed the windings at the secondary output ports S2, S4, S6. By using fast stator excitation through the windings at the secondary output ports S2, S4, S6, the main secondary output ports S1, S3, S5 can be forced to have very fast rise times to fed the converters 1241, 1243, 1245, which go to the PFNs 1251-1254 and pulsed loads 1261-1264. The system 1200 is capable of supporting multiple PFNs and multiple loads at each DFIM set. For example, the DFIM 1204 is coupled to multiple PFNs 1253-1254 and multiple loads 1263-1264.

Although FIGS. 12A and 12B illustrate one example of a hybrid energy storage system 1200 with constant DC and constant-amplitude AC current input, various changes may be made to FIGS. 12A and 12B. For example, while three DFIMs 1202-1204 are shown in series, the system 1200 could include more or fewer DFIMs. Also, the makeup and arrangement of the system 1200 are for illustration only. Components could be added, omitted, combined, or placed in any other configuration according to particular needs.

Figure 13A:
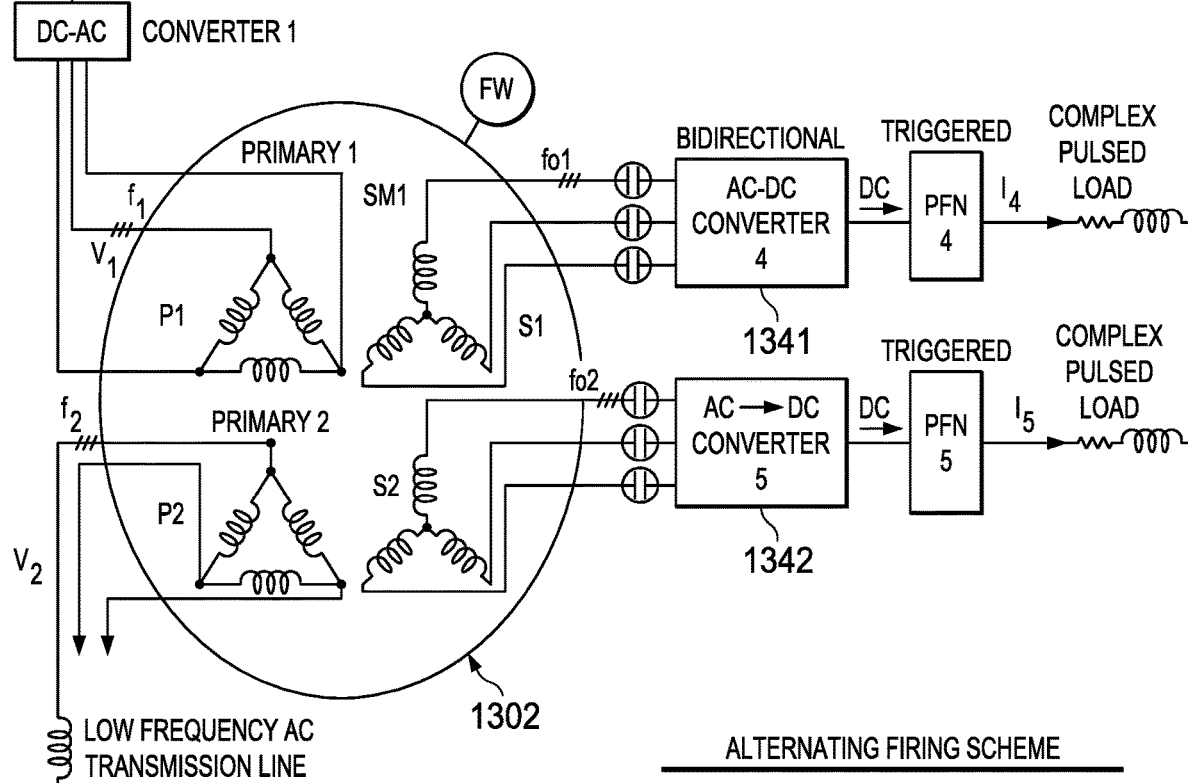
FIGS. 13A and 13B illustrate an example hybrid energy storage system having permanent-magnet field synchronous machines (SMs) according to this disclosure.
Figure 13B:
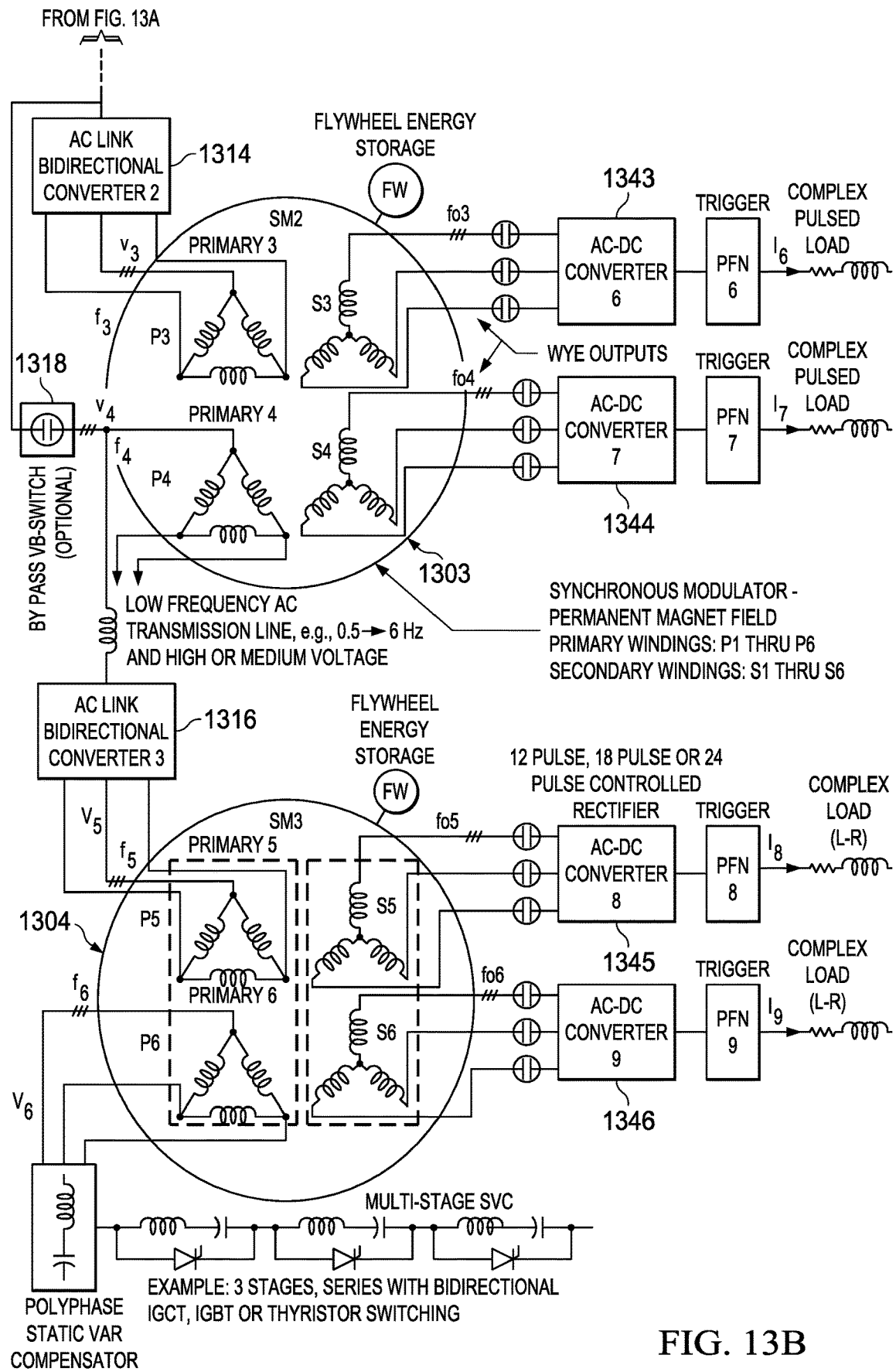

FIGS. 13A and 13B illustrate an example hybrid energy storage system 1300 having permanent-magnet field synchronous machines (SMs) according to this disclosure. The system 1300 includes many components that are the same as or similar to components disclosed in earlier figures. A detailed description of those components will not be repeated here.

As shown in FIGS. 13A and 13B, the system 1300 uses SMs 1302-1304 instead of DFIMs. Therefore, there is no rotor winding or rotor port. The system 1300 uses a DC constant current input main power supply 1310 (mainly MVDC), with intermediate conversion between the SMs 1302-1304 by AC link converters 1314-1316. Each SM 1302-1304 has a minimum of two output secondary ports (such as S1-S6) feeding identical AC-to-DC converters 1341-1346. The converters 1341-1346 are bidirectional and are high order phase numbers (such as 12 pulse, 18 pulse, or 24 pulse). The two secondary ports at each SM 1302-1304 alternate in duty cycle, such as when current I4 is ON only when current I5 is OFF and vice versa. This means that machine magneto-motive force (MMF) for the secondary outputs is always constant. This helps to maintain constant DC input current at the main supply. In some embodiments, the operating parameters are as follows.

Primary Frequency f1=f2, f3=f4, f5=f6 f2>f3, V2>V3, f4>f5, V4>V5 to yield constant flux in each winding

V5~V6, V3~V4, V1~V2

For the secondary output frequency, fo1>f1, fo3>f3, fo5>f5.

To maximize efficiency, the voltage-to-frequency ratio can be coordinated to maintain constant machine magnetic flux or constant V/F ratio for any particular winding.

In some embodiments, the primary windings P1 and P2 of the SM 1302 share a common PM rotor structure, whereas the secondary windings S1 and S2 share a common but separate rotor PM structure different from the primary windings. Thus, the secondary windings S1 and S2 are able to have a frequency range higher than the primary frequency range, which is advantageous for output AC-to-DC conversion. All SM windings in the system 1300 are variable frequency since the HESM concept relies upon flywheel storage being able to operate and extract or give energy over a wide range of shaft speeds. In FIGS. 13A and 13B, the AC link converters 1314-1316 may be replaced with conventional AC-DC rectifiers and DC-to-AC inverters so that all transmission lines can be constant-current DC with medium voltage levels. In case of component failure, a bypass vacuum interrupter, breaker, or switch 1318 is included to bypass the SM 1303 and the AC link converter 1314 without seriously affecting overall operations.

Although FIGS. 13A and 13B illustrate one example of a hybrid energy storage system 1300 having permanent-magnet field synchronous machines, various changes may be made to FIGS. 13A and 13B. For example, the makeup and arrangement of the system 1300 are for illustration only. Components could be added, omitted, combined, or placed in any other configuration according to particular needs.

Figure 14:
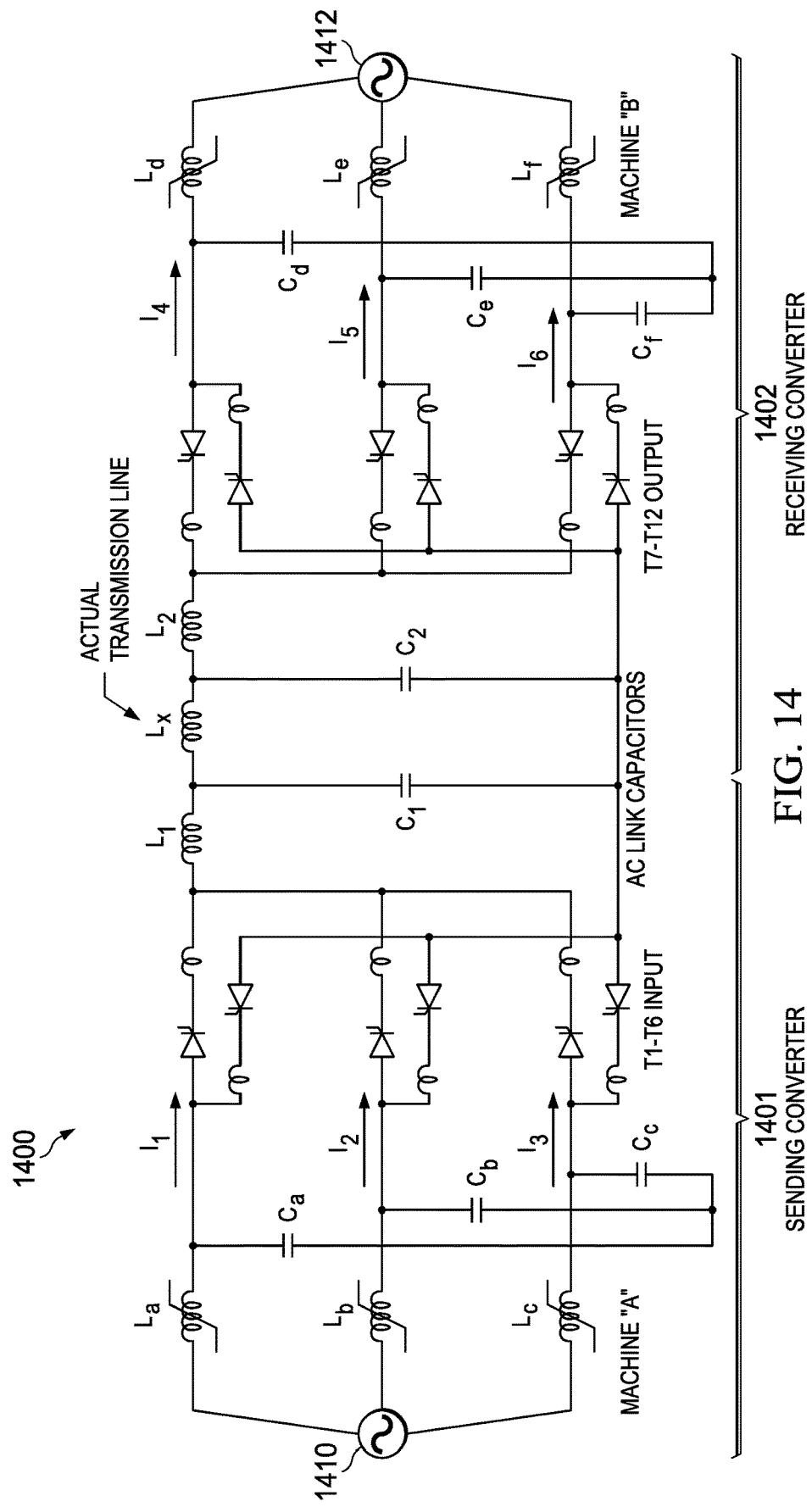
FIG. 14 illustrates an example AC link converter according to this disclosure.

FIG. 14 illustrates an example AC link converter 1400 according to this disclosure. The AC link converter 1400 (or portions thereof) could represent or be represented by the AC-to-AC converters 1214-1216 of FIGS. 12A and 12B or the AC link converters 1314-1316 of FIGS. 13A and 13B.

As shown in FIG. 14, the AC link converter 1400 includes a sending winding side 1401 and a receiving winding side 1402 on a DFIM or SM. The sides 1401 and 1402 join between inductors L1 and L2 located on the machine side of the converters, where Lx represents the actual transmission line or system inductance between zones. In some implementations, this inductance Lx may be a long distance, e.g., 10 miles or more. The AC link converter 1400 also includes a source 1410, which may be a primary winding P2 of a first DFIM (such as the DFIM 1202 of FIGS. 12A and 12B). The inductance L1 and capacitance C1 (or L2 and C2) are contained within the sending winding side 1401 (or 1402), along with multiple thyristors. An AC load 1412 may be a primary winding P3 of a second DFIM (such as the DFIM 1203 of FIGS. 12A and 12B).

Although FIG. 14 illustrates one example of an AC link converter 1400, various changes may be made to FIG. 14. For example, the makeup and arrangement of the AC link converter 1400 are for illustration only. Components could be added, omitted, combined, or placed in any other configuration according to particular needs.

The following provides a description of design parameters for a specific implementation of a one-megawatt "synchronous modulator" rotating electrical machine of the high speed doubly-fed induction type, which embraces various aspects of this disclosure as a single machine or in a system of rotating machines with multi-port and multi-function performance. Embodiments of this disclosure could include zero, one, some, or all of these design parameters.

General Machine Parameters

Machine Type: Wound-rotor doubly-fed induction machine with five ports

Baseline Power Rating: 1 megawatt at 10,000 rpm

Number of Stator Input Ports: 1

Number of Stator Output Ports: 2

Number of Rotor Input/Output Ports: 2

Machine directly coupled to flywheel energy storage device of 100 MJ

Duration of output pulsing: 200 seconds at 50% duty cycle

Stator Winding Details:

Number of poles: 6

Frequency at 10,000 rpm: 500 Hz

Winding type for each port: 3-phase, lap-wound, distributed over 72 slots

Coil span: 1 and 12

Input Port 1 and Output Port 2 Winding Layout: 4 slots/pole/phase

Current rating of main output winding at 1 MVA: 38.5 Amps at 5.0 kV 2 parallels per phase in wye configuration Insulation rating to ground: 12,500 Volts Insulation rating between windings: 25,000 Volts Insulation Type: Nomex 410

Conductor: Copper transposed & insulated Class H magnet wire

Winding average temperature rise: 160° C.

Input Port Winding Voltage rating: 4160 Volts line to line, 3 phase, variable frequency Output Port 1 winding voltage rating: 5000 Volts line to line, 9 phase at 500 Hz Output Port 2 winding voltage rating: 750 Volts line to line, 3 phase at 500 Hz Output Port 2 voltage after AC to DC rectification: 1000 VDC Rotor Winding Details Dual 3-phase rotor connections via 6 slip-rings Rotor Peripheral speed: 666 ft/s Rotor Diameter: 15.26 in.

Radial Airgap: 0.125 in.

Number of Poles: 6

Number of Slots: 54

Winding type: 3-phase wye, lap wound distributed over 54 slots in "skip pole" configuration Layout: 3 slots/pole/phase Conductor: Copper Class H daglass insulated magnet wire Coils in series per phase: 9

Coil span: 1 and 7 with 2 parallels/phase

Voltage rating of each rotor winding: 900 Volts line to line, 3 phase

Rated Nominal Slip: 3.0%

Note that the HESM architectures in this patent document are examples only and that a number of modifications could be made to the HESM architectures. Also note that the systems utilizing the HESM architectures in this patent document are examples only, a number of modifications could be made to the systems, and the HESM architectures could be used in any other suitable systems.

Among other things, the various HESMs and systems using HESMs could support the following features individually or in any suitable combination.

A system uses a medium voltage DC input bus to electrical machinery with multiple independent inputs, which may be at different voltage levels or different power levels.

A system uses low frequency alternating current (AC) in constant-current mode for long distance transmission between electrical machine hubs.

An electrical machine, forming the hub of an energy storage system, has the ability to operate from one or multiple main MVDC inputs simultaneously.

A system has the ability to have multiple electrical machines operating at different energy levels but with independent variable-voltage variable-frequency motor drives to modulate bidirectional energy to and from a main grid, a main turbine generator input, or other structure.

A hybrid system contains multiple main sources of energy storage, such as inertial-flywheel, ultra-capacitor, and electro-chemical (battery).

An electrical machine, either of a synchronous type or an asynchronous type (such as induction), supports dual or multiple excitation circuits, one for slow excitation (such as to suit steady-state loads) and one for fast field excitation (such as to suit pulsed power or fast rise time loads).

Fast excitation for either type of electrical machine has a pulse forming network of polyphase excitation, where output waveforms from either electro-chemical or ultra-capacitor DC sources are converted into a quasi-AC polyphase waveform and are displaced by about 120°, and waveforms may be constant voltage amplitude or exponentially-decaying alternating voltage when serving fast load pulses. This excitation can be imparted to a stator tertiary winding in both cases, rather than to a conventional rotor circuit.

An asynchronous induction machine can use a polyphase rotor excitation circuit, which permits slip frequency energy to be imparted to or absorbed by an electro-chemical energy source/sink connected to a rotor circuit though a bidirectional rectifier/inverter unit. Multiple polyphase rotor ports can be provided on each machine for this purpose with multiple energy sources to utilize lower voltages typical of a commercial battery or ultra-capacitor.

A power source of either a stator or rotor type of excitation circuit includes an ultra-capacitor or battery storage subsystem.

Multiple (such as four or more) battery sub-systems can be sequentially charged and sequentially discharged through use of two or more electrical machines, which transfer energy from a grid, a flywheel store, or other structure to the batteries.

Multiple (such as four or more) ultra-capacitor subsystems can be sequentially charged and sequentially discharged through use of an electrical machine with three or more sources of charging power (such as a main grid, an inertial storage, and a battery).

A system may allow for non-uniform battery characteristics and may permit discharge rates to be much higher than charge rates, yet the system can permit continuous firing of the main output with batteries contributing energy to each cycle on a continuing basis.

A system can charge X subsystems of batteries or ultra-capacitors in time segments, where other Y subsystems of batteries or ultra-capacitors are being discharged in a continuous fire mode, where X and Y are integers.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in this patent document should not be read as implying that any particular element, step, or function is an essential or critical element that must be included in the claim scope. Also, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," and "system" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the scope of this disclosure, as defined by the following claims.

What is claimed is:

1. A system comprising:
    a source configured to provide power to a medium-voltage direct current (MVDC) bus;
    a plurality of rotating electrical machines configured to receive the power from the MVDC bus, the plurality of rotating electrical machines comprising a first rotating electrical machine and a second rotating electrical machine, the first rotating electrical machine having an output stator port connected to an input stator port of the second rotating electrical machine, the first rotating electrical machine configured to act as a slave to the second rotating electrical machine, each rotating electrical machine mechanically connected to an inertial energy storage; and
    a plurality of isolated battery or ultra-capacitor subsystems electrically connected to each rotating electrical machine, the battery or ultra-capacitor subsystems configured to receive electrical energy from and provide electrical energy to each rotating electrical machine and the connected inertial energy storage.

2. The system of claim 1, wherein at least one of the rotating electrical machines is configured to sequentially charge and sequentially discharge the isolated battery or ultra-capacitor subsystems through multiple bidirectional electrical ports of the rotating electrical machine.

3. The system of claim 2, wherein:
at least two of the isolated battery or ultra-capacitor subsystems are at substantially different states of charge and have different internal impedances or electrical time constants, and
each rotating electrical machine is configured to accommodate the different states of charge by adjustment of an internal voltage of the rotating electrical machine.

4. The system of claim 3, wherein the rotating electrical machines are configured to selectively operate (i) in unison to provide parallel output power to multiple ports or (ii) sequentially to provide main pulse power output.

5. The system of claim 4, further comprising:
a pulsed excitation circuit configured to excite at least one of the rotating electrical machines to improve response time.

6. The system of claim 1, wherein:
each rotating electrical machine comprises a doubly-fed induction electrical machine (DFIM); and
each rotating electrical machine is configured for both motor and generator modes of operation.

7. The system of claim 1, wherein:
the plurality of isolated battery or ultra-capacitor subsystems comprises at least one battery subsystem and at least one ultra-capacitor subsystem; and
at least one of the rotating electrical machines is a synchronous machine.

8. A system comprising:
a power generator configured to provide power to a direct current (DC) bus;
a plurality of rotating electrical machines configured to receive the power from the DC bus and provide at least some of the power to multiple pulsed loads, the plurality of rotating electrical machines comprising a first rotating electrical machine and a second rotating electrical machine, the first rotating electrical machine having an output stator port connected to an input stator port of the second rotating electrical machine, the first rotating electrical machine configured to act as a slave to the second rotating electrical machine, each rotating electrical machine mechanically connected to an inertial energy storage; and
a plurality of isolated battery or ultra-capacitor subsystems electrically connected to each rotating electrical machine, the battery or ultra-capacitor subsystems configured to receive electrical energy from and provide electrical energy to each rotating electrical machine and the connected inertial energy storage.

9. The system of claim 8, wherein at least one of the rotating electrical machines is configured to sequentially charge and sequentially discharge the isolated battery or ultra-capacitor subsystems through multiple bidirectional electrical ports of the rotating electrical machine.

10. The system of claim 9, wherein:
at least two of the isolated battery or ultra-capacitor subsystems are at substantially different states of charge and have different internal impedances or electrical time constants, and
each rotating electrical machine is configured to accommodate the different states of charge by adjustment of an internal voltage of the rotating electrical machine.

11. The system of claim 10, wherein the rotating electrical machines are configured to selectively operate (i) in unison to provide parallel output power to multiple ports or (ii) sequentially to provide main pulse power output.

12. The system of claim 11, further comprising:
a pulsed excitation circuit configured to excite at least one of the rotating electrical machines to improve response time.

13. The system of claim 8, wherein:
each rotating electrical machine comprises a doubly-fed induction electrical machine (DFIM); and
each rotating electrical machine is configured for both motor and generator modes of operation.

14. The system of claim 8, wherein:
the plurality of isolated battery or ultra-capacitor subsystems comprises at least one battery subsystem and at least one ultra-capacitor subsystem; and
at least one of the rotating electrical machines is a synchronous machine.

15. A system comprising:
a source configured to provide power to a direct current (DC) bus;
a plurality of rotating electrical machines configured to receive the power from the DC bus, the plurality of rotating electrical machines comprising a first rotating electrical machine and a second rotating electrical machine, the first rotating electrical machine having an output stator port connected to an input stator port of the second rotating electrical machine, the first rotating electrical machine configured to act as a slave to the second rotating electrical machine, each rotating electrical machine mechanically connected to an inertial energy storage, each rotating electrical machine having at least one stator port coupled to one or more power converters that provide at least some of the power to one or more loads; and
a plurality of isolated battery or ultra-capacitor subsystems electrically connected to each rotating electrical machine, the battery or ultra-capacitor subsystems configured to receive electrical energy from and provide electrical energy to each rotating electrical machine and the connected inertial energy storage.

16. The system of claim 15, wherein at least one of the rotating electrical machines is configured to sequentially charge and sequentially discharge the isolated battery or ultra-capacitor subsystems through multiple bidirectional rotor ports of the rotating electrical machine.

17. The system of claim 16, wherein:
at least two of the isolated battery or ultra-capacitor subsystems are at substantially different states of charge and have different internal impedances or electrical time constants, and
each rotating electrical machine is configured to accommodate the different states of charge by adjustment of an internal voltage of the rotating electrical machine.

18. The system of claim 17, wherein the rotating electrical machines are configured to selectively operate (i) in unison to provide parallel output power to the one or more loads or (ii) sequentially to provide main pulse power output.

19. The system of claim 18, further comprising:
a pulsed excitation circuit configured to excite at least one of the rotating electrical machines to improve response time.

20. The system of claim 15, wherein:
each rotating electrical machine comprises a doubly-fed induction electrical machine (DFIM); and each rotating electrical machine is configured for both motor and generator modes of operation.

21. The system of claim 1, wherein:

each rotating electrical machine comprises a doubly-fed induction electrical machine configured for both motor and generator modes of operation;

the output stator port of the first rotating electrical machine is connected via an AC/AC converter to the input stator port of the second rotating electrical machine;

the first rotating electrical machine further includes an input stator port connected via a variable-voltage variable-frequency (VVVF) converter to the MVDC bus; and the plurality of isolated battery or ultra-capacitor subsystems are electrically connected via inverters to a rotor port of each rotating electrical machine.

* * * * *